(12) United States Patent
Kamimura et al.

(10) Patent No.: US 10,199,210 B2
(45) Date of Patent: Feb. 5, 2019

(54) SEMICONDUCTOR SUBSTRATE TREATMENT LIQUID, TREATMENT METHOD, AND METHOD FOR MANUFACTURING SEMICONDUCTOR-SUBSTRATE PRODUCT USING THESE

(71) Applicant: FUJIFILM Corporation, Tokyo (JP)

(72) Inventors: Tetsuya Kamimura, Shizuoka (JP); Yasuo Sugishima, Shizuoka (JP); Atsushi Mizutani, Shizuoka (JP)

(73) Assignee: FUJIFILM Corporation, Minato-Ku, Tokyo (JP)

( * ) Notice: Subject to any disclaimer, the term of this patent is extended or adjusted under 35 U.S.C. 154(b) by 0 days.

(21) Appl. No.: 15/152,676

(22) Filed: May 12, 2016

(65) Prior Publication Data

US 2016/0254139 A1     Sep. 1, 2016

Related U.S. Application Data

(63) Continuation of application No. PCT/JP2014/080223, filed on Nov. 14, 2014.

(30) Foreign Application Priority Data

Nov. 18, 2013   (JP) .................................. 2013-238344

(51) Int. Cl.
*C11D 7/32*         (2006.01)
*H01L 21/02*        (2006.01)
(Continued)

(52) U.S. Cl.
CPC ........ *H01L 21/02057* (2013.01); *B08B 3/041* (2013.01); *B08B 3/08* (2013.01);
(Continued)

(58) Field of Classification Search
CPC .................................................. C11D 11/0047
(Continued)

(56) References Cited

U.S. PATENT DOCUMENTS

| 2003/0228744 A1 | 12/2003 | Kohno et al. |
| 2004/0077512 A1* | 4/2004 | Kakizawa ............. C11D 1/835 510/175 |

(Continued)

FOREIGN PATENT DOCUMENTS

| JP | 2001-119026 A | 4/2001 |
| JP | 2004-6819 A | 1/2004 |

(Continued)

OTHER PUBLICATIONS

International Search Report for PCT/JP2014/080223 dated Jan. 27, 2015 [PCT/ISA/210].

(Continued)

*Primary Examiner* — Gregory E Webb
(74) *Attorney, Agent, or Firm* — Sughrue Mion, PLLC

(57) ABSTRACT

Provided is a semiconductor substrate treatment liquid which removes an organic material on the top of a semiconductor substrate from the semiconductor substrate having a Ge-containing layer that includes germanium (Ge) or cleans the surface thereof, and the treatment liquid includes a liquid chemical component which adjusts the pH of the treatment liquid to be in a range of 5 to 16 and an anticorrosive component which is used to prevent the Ge-containing layer.

26 Claims, 2 Drawing Sheets

(51) Int. Cl.
  *H01L 21/311* (2006.01)
  *G03F 7/42* (2006.01)
  *B08B 3/04* (2006.01)
  *B08B 3/08* (2006.01)
  *B08B 3/10* (2006.01)
  *B08B 7/00* (2006.01)
  *B08B 9/00* (2006.01)
  *C11D 7/26* (2006.01)
  *C11D 11/00* (2006.01)
  *H01L 21/3105* (2006.01)
  *C11D 3/00* (2006.01)
  *C11D 3/37* (2006.01)
  *H01L 21/8238* (2006.01)

(52) U.S. Cl.
  CPC .............. *B08B 3/10* (2013.01); *B08B 7/0035* (2013.01); *B08B 9/00* (2013.01); *C11D 3/0073* (2013.01); *C11D 3/3719* (2013.01); *C11D 3/3723* (2013.01); *C11D 3/3773* (2013.01); *C11D 3/3776* (2013.01); *C11D 7/261* (2013.01); *C11D 7/265* (2013.01); *C11D 7/267* (2013.01); *C11D 7/32* (2013.01); *C11D 7/3209* (2013.01); *C11D 7/3245* (2013.01); *C11D 7/3263* (2013.01); *C11D 7/3272* (2013.01); *C11D 7/3281* (2013.01); *C11D 11/0047* (2013.01); *G03F 7/425* (2013.01); *H01L 21/31058* (2013.01); *H01L 21/31133* (2013.01); *H01L 21/823814* (2013.01); *H01L 21/823857* (2013.01)

(58) Field of Classification Search
  USPC .................................................. 510/175, 176
  See application file for complete search history.

(56) References Cited

U.S. PATENT DOCUMENTS

| | | | | |
|---|---|---|---|---|
| 2004/0180300 | A1* | 9/2004 | Minsek | .................... C11D 7/06 430/329 |
| 2008/0004197 | A1 | 1/2008 | Kneer | |
| 2009/0133716 | A1* | 5/2009 | Lee | ........................... C09G 1/02 134/3 |
| 2011/0117751 | A1 | 5/2011 | Sonthalia et al. | |
| 2011/0281436 | A1* | 11/2011 | Inaba | ..................... C11D 7/265 438/710 |
| 2013/0244443 | A1 | 9/2013 | Mizutani et al. | |
| 2013/0330927 | A1* | 12/2013 | Kumagai | ................ G03F 7/425 438/675 |

FOREIGN PATENT DOCUMENTS

| | | |
|---|---|---|
| JP | 2004-048039 A | 2/2004 |
| JP | 2005-189660 A | 7/2005 |
| JP | 2005-268308 A | 9/2005 |
| JP | 2008-166809 A | 7/2008 |
| JP | 2009-542849 A | 12/2009 |
| JP | 2011-517328 A | 6/2011 |
| JP | 2012-49391 A | 3/2012 |
| JP | 2012-94702 A | 5/2012 |
| JP | 2012-94703 A | 5/2012 |
| JP | 2013-45961 A | 3/2013 |
| JP | 2013-197213 A | 9/2013 |
| JP | 2013-197214 A | 9/2013 |

OTHER PUBLICATIONS

Communication dated Mar. 21, 2017, from the Japanese Patent Office in counterpart application No. 2013-238344.
Communication dated Apr. 1, 2017 issued by the Korean Intellectual Patent Office in counterpart application No. 10-2016-7014337.
Communication dated Jan. 18, 2018, from Taiwanese Intellectual Property Office in counterpart application No. 103139760.
Communication dated Dec. 1, 2017, from State Intellectual Property Office of the P.R.C. in counterpart application No. 201480062820.1.
Communication dated Jul. 25, 2018 from the State Intellectual Property Office of the P.R.C. in counterpart Chinese application No. 201480062820.1.

* cited by examiner

SEMICONDUCTOR SUBSTRATE TREATMENT LIQUID, TREATMENT METHOD, AND METHOD FOR MANUFACTURING SEMICONDUCTOR-SUBSTRATE PRODUCT USING THESE

CROSS-REFERENCE TO RELATED APPLICATIONS

This application is a Continuation of PCT International Application No. PCT/JP2014/080223 filed on Nov. 14, 2014, which claims priority under 35 U.S.C. § 119 (a) to Japanese Patent Application No. 2013-238344 filed in Japan on Nov. 18, 2013. Each of the above applications is hereby expressly incorporated by reference, in its entirety, into the present application.

BACKGROUND OF THE INVENTION

1. Field of the Invention

The present invention relates to a semiconductor substrate treatment liquid such as a rinsing liquid, a developer, or a stripper, a treatment method therefor, and a method of manufacturing a semiconductor-substrate product using these.

2. Description of the Related Art

A process of manufacturing a semiconductor device includes various processes such as a lithography process, an etching process, and an ion implantation process. The process of manufacturing a semiconductor device typically includes a process of performing a treatment on an organic material after completion of each process or before moving to the next process. For example, a treatment of stripping and removing a resist remaining on a surface of a substrate is carried out (stripping treatment). Alternatively, a treatment of cleaning the surface is occasionally carried out after the removal or stripping (rinsing treatment). Further, it is necessary to precisely remove a resist only at a desired location in a developing process (developing process).

As a conventional method for stripping an organic residue, a process of using a concentrated sulfuric acid hydrogen peroxide mixture (SPM) or an ammonia-peroxide mixture (APM) is used (see JP2005-268308A, JP2005-189660A, and JP2012-049391A). In this manner, a resist after a substrate is processed can be effectively stripped off. Meanwhile, according to this method, since the oxidizability of a treatment liquid is extremely strong even though the release properties of the resist are excellent, materials constituting the substrate may be damaged. When the recent situations of miniaturization of a semiconductor device and advancement of high integration are considered, it is desirable to avoid such damage even if the damage is minute. Further, even from the viewpoint of reliability, the method of using an SPM or an APM is not necessarily satisfactory due to handleability of chemicals and occurrence of a rapid increase in the temperature.

For this reason, a cleaning technique in which there is little influence on a gate insulating film or a substrate and which has excellent reliability is required, and a new treatment method using foaming of carbonic acid gas has been suggested as one of the cleaning techniques (see JP2012-094703A and JP2012-094702A).

SUMMARY OF THE INVENTION

In the related art, silicon (Si) has been widely used as a material of a semiconductor substrate. Since the required performance for a semiconductor device has been improved, a technique (JP2001-119026A and JP2008-166809A) that uses germanium (Ge) has been attracting attention and the practical use thereof has been attempted. Meanwhile, it is of concern that germanium has lower resistance to chemicals compared to silicon which may damage a layer containing germanium of a semiconductor substrate is damaged in each treatment of the manufacturing process.

Here, an object of the present invention is to provide a treatment liquid and a treatment method which can be applied to a semiconductor substrate having a layer that contains germanium and suppress or prevent damage to the germanium, and desirably remove an organic material on the top of the semiconductor substrate or clean the surface of the substrate and a method of manufacturing a semiconductor-substrate product using these. More specifically, another object of the present invention is to provide a treatment liquid and a treatment method suitable for a rinsing treatment, a developing treatment, and a stripping treatment as treatments described above and a method of manufacturing a semiconductor-substrate product using these.

The above-described problems are solved by using the following means.

[1] A semiconductor substrate treatment liquid which removes an organic material on the top of a semiconductor substrate from the semiconductor substrate having a Ge-containing layer that includes germanium (Ge) or cleans the surface thereof, the treatment liquid comprising: a liquid chemical component which adjusts the pH of the treatment liquid to be in a range of 5 to 16, and an anticorrosive component which is used to prevent corrosion of the Ge-containing layer.

[2] The treatment liquid according to [1], in which the concentration of the anticorrosive component is in a range of 0.01% by mass to 20% by mass.

[3] The treatment liquid according to [1] or [2], in which the anticorrosive component is at least one selected from a compound represented by any of the following Formulae (1) to (6), (10), and (11) and a compound having a repeating unit represented by any of the following Formulae (7) to (9).

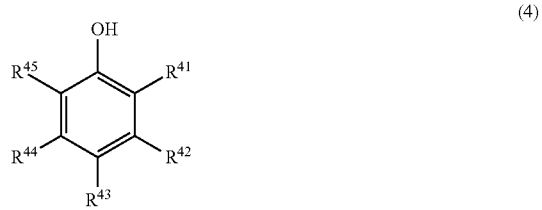

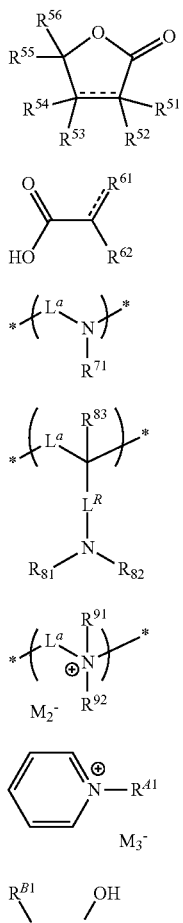

[$R^{11}$ to $R^{14}$, $R^{21}$, $R^{22}$, $R^{31}$ to $R^{34}$, $R^{41}$ to $R^{45}$, $R^{51}$ to $R^{56}$, $R^{61}$, $R^{62}$, $R^{71}$, $R^{81}$ to $R^{83}$, $R^{91}$, $R^{92}$, $R^{A1}$, $R^{B1}$, and $R^{B2}$ each independently represent a group including a hydrogen atom, a carbon atom, an oxygen atom, a sulfur atom, or a nitrogen atom, $L^a$ represents a linking group, $M_1^-$, $M_2^-$, and $M_3^-$ represent a counter anion, the broken line in Formula (5) represents any of a single bond and a double bond, and in the case where the broken line represents a double bond, $R^{52}$ and $R^{54}$ are not present, the broken line in Formula (6) means that $R^{61}$ represents an oxygen atom or a sulfur atom so that the oxygen atom or the sulfur atom may constitute a carbonyl group (C=O) or a thiocarbonyl group (C=S) together with a carbon atom to which the oxygen atom or the sulfur atom is bonded, and $L^R$ represents a single bond or a linking group.]

[4] The treatment liquid according to [3],
in which, in Formula (1), $R^{11}$ to $R^{14}$ each independently represent an alkyl group having 1 to 24 carbon atoms, an alkenyl group having 2 to 24 carbon atoms, or an aryl group having 6 to 14 carbon atoms, and at least one of these has 2 or more carbon atoms;
in Formula (2), $R^{21}$ and $R^{22}$ each independently represent a hydrogen atom, an alkyl group having 1 to 12 carbon atoms, an alkenyl group having 2 to 12 carbon atoms, an aryl group having 6 to 14 carbon atoms, an acyl group having 1 to 12 carbon atoms, an alkoxy group having 1 to 12 carbon atoms, an aminocarbonyl group, a hydrazino group, a hydrazinocarbonyl group, or $C(NR^N)NR^N_2$ ($R^N$ represents a hydrogen atom, an alkyl group having 1 to 12 carbon atoms, an alkenyl group having 2 to 12 carbon atoms, or an aryl group having 6 to 14 carbon atoms);
in Formula (3), $R^{31}$ to $R^{34}$ each independently have the same definitions as those for $R^{21}$ and $R^{22}$;
in Formula (4), $R^{41}$ to $R^{45}$ each independently represent a hydrogen atom, a hydroxy group, a carboxyl group, an alkyl group having 1 to 12 carbon atoms, an alkenyl group having 2 to 12 carbon atoms, or an aryl group having 6 to 14 carbon atoms;
in Formula (5), $R^{51}$ to $R^{56}$ each independently represent a hydrogen atom, a hydroxy group, a carboxyl group, an alkyl group having 1 to 12 carbon atoms, an alkenyl group having 2 to 12 carbon atoms, or an aryl group having 6 to 14 carbon atoms;
in Formula (6), $R^{61}$ and $R^{62}$ each independently represent a hydrogen atom, a hydroxy group, a carboxyl group, an alkyl group having 1 to 12 carbon atoms, an alkenyl group having 2 to 12 carbon atoms, an aryl group having 6 to 14 carbon atoms, or an oxygen atom that forms a carbonyl group;
in Formula (7), $R^{71}$ represents a hydrogen atom, an alkyl group having 1 to 12 carbon atoms, an alkenyl group having 2 to 12 carbon atoms, or an aryl group having 6 to 14 carbon atoms, and $L^a$ represents a methylene group;
in Formula (8), $R^{81}$ and $R^{82}$ represent a hydrogen atom, an alkyl group having 1 to 12 carbon atoms, an alkenyl group having 2 to 12 carbon atoms, or an aryl group having 6 to 14 carbon atoms, $L^R$ represents a single bond, an alkylene group having 1 to 12 carbon atoms, an alkenylene group having 2 to 12 carbon atoms, an arylene group having 6 to 14 carbon atoms, or an aralkylene group having 7 to 15 carbon atoms, and $R^{83}$ represents a hydrogen atom or a methyl group;
in Formula (9), $R^{91}$ and $R^{92}$ represents a hydrogen atom, an alkyl group having 1 to 12 carbon atoms, an alkenyl group having 2 to 12 carbon atoms, or an aryl group having 6 to 14 carbon atoms, and $L^a$ represents a methylene group;
in Formula (10), $R^{A1}$ represents an alkyl group having 1 to 24 carbon atoms, an alkenyl group having 2 to 24 carbon atoms, or an aryl group having 6 to 14 carbon atoms; and
in Formula (11), $R^{B1}$ and $R^{B2}$ each independently represent an alkyl group having 1 to 12 carbon atoms, an alkenyl group having 2 to 12 carbon atoms, an aryl group having 6 to 14 carbon atoms, or an amino group.

[5] The treatment liquid according to [3] or [4], in which a compound selected from a compound represented by Formulae (1) or (10) and a compound having a repeating unit represented by any of Formulae (7) to (9) is used as an inhibitor type anticorrosive component, and a compound represented by any of Formulae (2) to (6) and (1) is used as a reducing agent type anticorrosive component.

[6] The treatment liquid according to any one of [1] to [5] which is a rinsing liquid used to clean the semiconductor substrate.

[7] The treatment liquid according to any one of [1] to [5] which is a developer used to develop a resist on the semiconductor substrate.

[8] The treatment liquid according to any one of [1] to [5], in which the organic material includes a modified-resist component, and the treatment liquid is a stripper which strips the organic material.
[9] The treatment liquid according to any one of [1] to [8], in which the liquid chemical component is water when the treatment liquid is used as a rinsing liquid, is an alkali compound when the treatment liquid is used as a developer, and is an alcohol compound, an aprotic solvent, an organic amine compound, or a combination of these when the treatment liquid is used as a stripper.
[10] The treatment liquid according to [9], in which a C Log P value of the alcohol compound is 0 or greater.
[11] A semiconductor substrate treatment liquid which removes an organic material on the top of a semiconductor substrate from the semiconductor substrate having a Ge-containing layer that includes germanium (Ge) or cleans the surface thereof, the treatment liquid comprising: a liquid chemical component, and an anticorrosive component which is used to prevent corrosion of the Ge-containing layer.
[12] The treatment liquid according to [11], in which the liquid chemical component is water when the treatment liquid is used as a rinsing liquid, is an alkali compound when the treatment liquid is used as a developer, and is an alcohol compound, an aprotic solvent, an organic amine compound, or a combination of these when the treatment liquid is used as a stripper.
[13] A method for treating a semiconductor substrate comprising: removing an organic material on the top of a semiconductor substrate from the semiconductor substrate having a Ge-containing layer that includes germanium (Ge) or cleaning the surface thereof, in which the treatment liquid includes a liquid chemical component which adjusts the pH of the treatment liquid to be in a range of 5 to 16, and an anticorrosive component which is used to prevent corrosion of the Ge-containing layer.
[14] The treatment method according to [13], in which the anticorrosive component is at least one selected from a compound represented by any of the following Formulae (1) to (6), (10), and (11) and a compound having a repeating unit represented by any of the following Formulae (7) to (9).

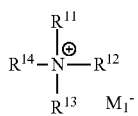  (1)

  (2)

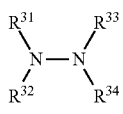  (3)

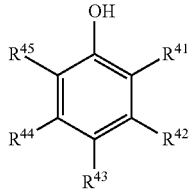  (4)

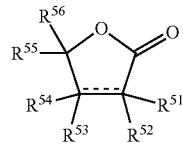  (5)

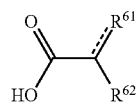  (6)

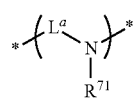  (7)

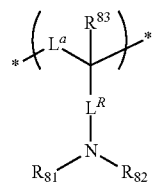  (8)

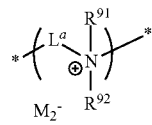  (9)

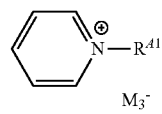  (10)

$R^{B1}$  OH
  \   /
   C=N
  /
$R^{B2}$    (11)

[$R^{11}$ to $R^{14}$, $R^{21}$, $R^{22}$, $R^{31}$ to $R^{34}$, $R^{41}$ to $R^{45}$, $R^{51}$ to $R^{56}$, $R^{61}$, $R^{62}$, $R^{71}$, $R^{81}$ to $R^{83}$, $R^{91}$, $R^{92}$, $R^{41}$, $R^{B1}$, and $R^{B2}$ each independently represent a group including a hydrogen atom, a carbon atom, an oxygen atom, a sulfur atom, or a nitrogen atom, $L^a$ represents a linking group, $M_1^-$, $M_2^-$, and $M_3^-$ represent a counter anion, the broken line in Formula (5) represents any of a single bond and a double bond, and in the case where the broken line represents a double bond, $R^{52}$ and $R^{54}$ are not present, the broken line in Formula (6) means that $R^{61}$ represents an oxygen atom or a sulfur atom so that the oxygen atom or the sulfur atom may constitute a carbonyl group (C=O) or a thiocarbonyl group (C=S) together with a carbon atom to which the oxygen atom or the sulfur atom is bonded, and $L^R$ represents a single bond or a linking group.]

[15] The treatment method according to [13] or [14], in which the liquid chemical component is water when the treatment liquid is used as a rinsing liquid, is an alkali component when the treatment liquid is used as a developer, and is an alcohol compound, an aprotic solvent, an organic amine compound, or a combination of these when the treatment liquid is used as a stripper.
[16] A method of manufacturing a semiconductor-substrate product comprising: treating a semiconductor substrate according to the treatment method according to any one of [13] to [15] to obtain a semiconductor-substrate product.

[17] An anticorrosive of a Ge-containing layer which includes germanium (Ge) applied to a semiconductor substrate, consisting of: a compound represented by any of the following Formulae (1) to (6), (10), and (11), and a compound having a repeating unit represented by any of the following Formulae (7) to (9).

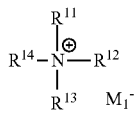

(1)

(2)

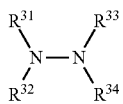

(3)

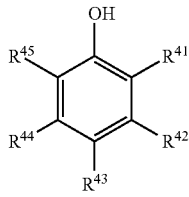

(4)

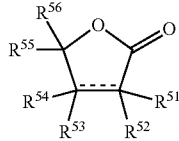

(5)

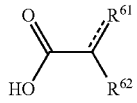

(6)

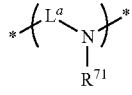

(7)

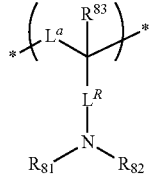

(8)

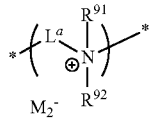

(9)

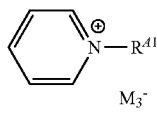

(10)

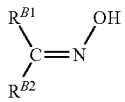

(11)

[$R^{11}$ to $R^{14}$, $R^{21}$, $R^{22}$, $R^{31}$ to $R^{34}$, $R^{41}$ to $R^{45}$, $R^{51}$ to $R^{56}$, $R^{61}$, $R^{62}$, $R^{71}$, $R^{81}$ to $R^{83}$, $R^{91}$, $R^{92}$, $R^{A1}$, $R^{B1}$, and $R^{B2}$ each independently represent a group including a hydrogen atom, a carbon atom, an oxygen atom, a sulfur atom, or a nitrogen atom, $L^a$ represents a linking group, $M_1^-$, $M_2^-$, and $M_3^-$ represent a counter anion, the broken line in Formula (5) represents any of a single bond and a double bond, and in the case where the broken line represents a double bond, $R^{52}$ and $R^{54}$ are not present, the broken line in Formula (6) means that $R^{61}$ represents an oxygen atom or a sulfur atom so that the oxygen atom or the sulfur atom may constitute a carbonyl group (C=O) or a thiocarbonyl group (C=S) together with a carbon atom to which the oxygen atom or the sulfur atom is bonded, and $L^R$ represents a single bond or a linking group.]

According to the treatment liquid and the treatment method of the present invention, it is possible to apply the treatment liquid and the treatment method to a semiconductor substrate having a layer that contains germanium and suppress or prevent damage to the germanium, and desirably remove an organic material on the top of the semiconductor substrate or clean the surface of the substrate. More specifically, a treatment liquid and a treatment method are suitable for a rinsing treatment, a developing treatment, or a stripping treatment in the manufacturing for the semiconductor.

According to the method for manufacturing a semiconductor-substrate product of the present invention, when the above-described treatment liquid and the treatment method having excellent production suitability are applied, it is possible to provide a semiconductor-substrate product such as a complementary metal-oxide semiconductor (CMOS) with excellent product quality.

The above-described and other characteristics and advantages of the present invention will become evident from the description below and the accompanying drawings.

DESCRIPTION OF THE PREFERRED EMBODIMENTS

[Stripping Treatment]

Figure 1A:
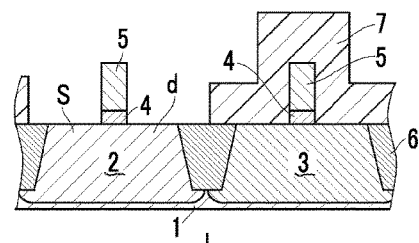
FIGS. 1A to 1D are process explanatory sectional views schematically illustrating a part of a process of manufacturing a semiconductor-substrate product according to an embodiment of the present invention.

First, as an aspect of using a treatment liquid of the present invention, a stripping treatment of an organic material will be described with reference to FIGS. 1A to 1D. FIGS. 1A to 1D show a process of the stripping treatment performed on a modified resist (modified organic material-containing layer) using an example of a process of manufacturing a CMOS. In FIG. 1A, a resist 7 is provided on a prepared semiconductor substrate. The semiconductor substrate here includes wells 2 and 3 including germanium, which are formed thereon, as a region in which a transistor is formed on a silicon substrate 1. Desired semiconductor properties (an n-type and a p-type) are provided for each well by ion-implanting arsenic, boron, or phosphorus. The semiconductor substrate of the present embodiment is in a state in which the surface of the well 2 side is exposed and the well 3 side is covered by the resist 7.

Figure 1B:
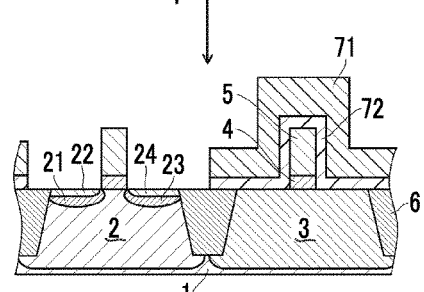

Next, in FIG. 1B, sources (21 and 22) and drains (23 and 24) are formed on the well 2. The sources and the drains may be formed according to a usual method, and processing carried out by performing an ion implantation process and a salicide process. First, the well 2 of the semiconductor substrate of FIG. 1A is coated with a suitable resist and specific conductivity type ions are implanted to an s region of FIG. 1A. In this manner, the regions constituting the sources are formed. Meanwhile, the regions constituting the drains are formed by changing the arrangement of resists and implanting opposite conductivity type ions to a d region of FIG. 1A. Thereafter, a layer of a metal such as titanium, nickel, or nickel platinum is formed so as to cover the surface of the substrate in the s region and the d region described above. Germanium silicide layers 22 and 24 are formed by annealing the metal layer. These layers function as an electrode unit exhibiting high conductivity in the sources and drains. By performing such a process, a substrate structure that includes sources and drains having a source base portion 21, the silicide layer 22, a drain base portion 23, and the silicide layer 24 is formed. In the present embodiment, an example in which a gate insulating film 4 and a gate electrode 5 are formed in advance is shown, but the present invention is not limited thereto. For example, a dummy gate is applied thereto so that a gate may be formed after the salicide process.

In the present invention, a layer including germanium is referred to as a germanium-containing layer (Ge-containing layer) in a wide sense, and the germanium-containing layer in the above-described example includes the wells 2 and 3, the source base portion 21, the source silicide portion 22, the drain base portion 23, and the drain silicide portion 24.

An example of the constituent material of the CMOS manufactured in the preferred embodiment of the present invention is described below. In this case, the present invention is not limitatively interpreted by the example below.

1: Silicon substrate: Si
4: Gate insulating film: $HfO_2$ (High-k)
5: Gate electrode: Al, W, polysilicon
21: Source base portion: SiGe, Ge
22: Source silicide portion: SiGe silicide, Ge silicide
23: Drain base portion: SiGe, Ge
24: Drain silicide portion: SiGe silicide, Ge silicide
Side wall (not illustrated): SiOCN, SiN, $SiO_2$ (low-k)
Cap (not illustrated): TiN In the present embodiment, since the ion implantation process or the salicide process are performed for the purpose of forming the sources and the drains described above, the resist 7 applied onto the substrate before the processes are performed undergoes modification. In the example shown in the figure, a modified resist 71 is mainly affected by ion implantation and it is considered that the modified resist 71 is in a chemically changed state which is different from the state in which the resist 7 is provided on the substrate. When the resist undergoes such modification, the resist is carbonized and is unlikely to be stripped off unlike a typical resin. Particularly, in the present invention, it is preferable that the ion implantation is often applied under the conditions of so-called high dose implantation strip (HDIS) because the effects thereof are remarkably exhibited. Typically, a case where the dosage of impurities to be ion-implanted exceeds $1 \times 10^{14}$ cm$^{-2}$ is referred to as a high dosage, and the resist pattern is affected by ion impact and carbonized so that the surface of the resist pattern is significantly cured. Particularly the resist pattern on which a cured film is formed is unlikely to be removed. According to the preferred embodiment of the present invention, even such a modified resist can be suitably handled.

Figure 1C:
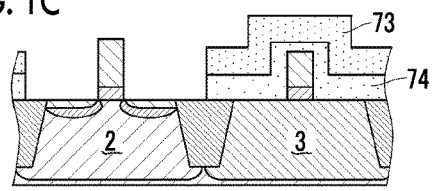
Figure 1D:
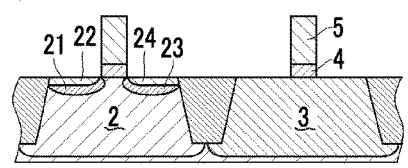

FIG. 1D illustrates the above-described modified resist 71 and an unmodified resist 72 which are stripped and removed by a stripper described below. According to the stripper of the preferred embodiment of the present invention, it is possible to excellently strip a resist, in which damage to the surface of the wells 2 and 3 including germanium is suppressed. Particularly, the present inventors confirmed that an unsaturated bond (a double bond and a triple bond) is generated in a modified product of a resist in HDIS and thus it is preferable that moderate hydrophobicity is provided for a treatment liquid so that the unsaturated bond is dissolved and removed. From this viewpoint, as an anticorrosive component, it is preferable to apply a compound having a suitable number of carbon atoms. The details thereof will be described below.

FIG. 1C illustrates an example of a treatment in which plasma ashing is combined with a stripper according to another embodiment of the present invention. In this example, the substrate on which the resist of FIG. 1B is provided is irradiated with plasma and the above-described modified resist 71 is mainly removed. The modified resist 71 is unlikely to be stripped using a stripper in some cases. In such a case, a treatment in which plasma ashing is combined with the stripper is effective as in the present example. Meanwhile, a plasma-modified resist 73 remaining because of this treatment and a plasma-unmodified resist 74 begin to have stripping difficulty, which is different from the description above, due to the state of modification thereof. For example, the portion of the modified resist 73 is turned into ashes because of the plasma treatment and is unlikely to be dissolved in some cases. According to the stripper of the preferred embodiment of the present invention, it is possible to desirably strip and remove such a plasma-modified resist.

Moreover, an embodiment of a stripper of a modified resist is described here, but an etching solution in the present invention can be used as a rinsing liquid or a developer as described below.

The above-described plasma ashing may be carried out according to a usual method, and oxygen plasma ashing or the like can be applied. However, the material of the substrate is occasionally damaged by the oxygen plasma. For this reason, an improved process described below may be applied in order to avoid the material from being damaged. JP2010-098279A suggests that a gas including hydrogen, a weak oxidant, and a fluorine-containing gas is introduced into a plasma source. Specifically, a plasma-activated gas including elemental hydrogen, a weak oxidant, and a fluorine-containing gas is allowed to flow in the semiconductor substrate together with an inert gas to react with the material of the semiconductor substrate. Examples of the weak oxidant include carbon dioxide, carbon monoxide, nitrogen dioxide, nitrogen oxide, water, hydrogen peroxide, and a combination of these. Examples of the fluorine-containing gas include carbon tetrafluoride, $C_2F_6$, $C_3F_8$, hydrofluorocarbon, $CHF_3$, $CH_2F_2$, elemental fluorine, nitrogen trifluoride, sulfur hexafluoride, and a combination of these. Examples of the inert gas include argon, helium, nitrogen, and a combination of these.

The gas to be introduced into a plasma source may or may not be mixed with another gas and can be introduced in an amount of 0.1% by volume to 10% by volume. The inert gas is introduced at a volume flow of approximately two times the volume flow of the active gas. The plasma is generated as a remote plasma using an RF output of 300 W to 10 KW. The temperature of the semiconductor substrate may be in a range of approximately 160° C. to 500° C. when a gas is brought into contact with the semiconductor substrate. The process pressure can be set to be in a range of 300 mTorr to 2 Torr.

Further, in the present specification, the above-described resist, a modified resist, an unmodified resist, and even an organic residue are referred to as an organic material, and a layer including an organic material is generally referred to as an organic material-containing layer. An organic material or an organic material-containing layer may be mixed with an inorganic material within the range in which the effects of the present invention are exhibited.

[Rinsing Treatment]

It is preferable that the treatment liquid of the present invention is used as a rinsing liquid. The rinsing liquid indicates a liquid chemical provided for the purpose of cleaning a semiconductor substrate after the substrate is subjected to a treatment using a liquid chemical and gas species. As an example, the rinsing liquid means a treatment liquid applied to the surface of the substrate as a post-treatment after a resist is stripped off as described above. That is, in an aspect of the rinsing treatment, the surface of the substrate is cleaned to remove not only an organic material but also an inorganic material therefrom. A small amount of residues remaining on the substrate can be removed from the surface thereof by applying the rinsing liquid thereto. In addition, depending on the additive components thereof, the rinsing liquid contributes to protection of the surface of the substrate. The rinsing liquid of the preferred embodiment of the present invention can be effectively used for removal of an extremely small amount of the organic residues and be useful particularly for protection of a germanium-containing layer exposed to the surface of the substrate. For example, when this rinsing liquid is applied, an effect of preventing damage to the surface of the substrate, such as erosion or corrosion, can be expected in the subsequent processing process.

[Developing Treatment]

It is preferable that the treatment liquid of the present invention is used as a developer. The developer is used in an aspect for dissolving and removing a portion exposed using a photomask when a resist is disposed on the surface of the substrate (positive type) or in an aspect for curing the exposed portion and removing an unexposed portion (negative type). Since the developer contains, for example, an alkali component, a resin is dissolved and a resist in the portion thereof can be removed by reacting the developer with an acidic group (carboxyl group or the like) or a phenolic hydroxyl group present in the resist. From this viewpoint, it is preferable that the developer of the present invention contains an alkali component. The details such as the formulation thereof or the like will be described below. The positive type resist will be described with reference to examples illustrated in FIGS. 1A to 1D. In order to form the semiconductor substrate of FIG. 1A, an aspect in which the resist is applied to the entire substrate and the well 3 on the right side is shielded by a photomask such that the upper portion of the well 3 is covered by the photomask is exemplified. Meanwhile, the upper portion of the well 2 on the left side is not shielded and the resist of this portion is exposed to light. In this manner, a portion other than the resist 7 is softened (solubilized). Next, by applying the developer to the entire substrate, a state in which the resist of the unexposed portion is dissolved and removed and the resist of a desired portion remains is formed.

In the present specification, the term semiconductor substrate is used to describe the entire substrate structure including not only a wafer but also a substrate for which a circuit structure is provided. A semiconductor substrate member indicates a member constituting the semiconductor substrate defined as above and may be formed of one material or a plurality of materials. Further, a processed semiconductor substrate is distinguished and referred to as a semiconductor-substrate product in some cases, and when further distinguished, if necessary, a chip taken out by adding a process to the semiconductor substrate and carrying out dicing thereon and a processed product thereof are referred to as a semiconductor device. In other words, a semiconductor device belongs to a semiconductor-substrate product in a wide sense. The direction of the semiconductor substrate is not particularly limited, but, in the present specification, the gate side is set to the upward direction and the silicon substrate side is set to the downward direction for the convenience of description. Moreover, in the accompanying drawings, the structure of the semiconductor substrate or the member thereof is simplified for illustration and may be interpreted as a necessary form if necessary.

[Treatment Liquid]

Subsequently, the preferred embodiment of the treatment liquid of the present invention will be described. The treatment liquid of the present embodiment contains a specific liquid chemical component and an anticorrosive component used to protect a Ge-containing layer from corrosion. Since the liquid chemical component varies for each embodiment, preferable compounds thereof will be described in each embodiment. Hereinafter, first, anticorrosive components common in all examples will be described.

(Anticorrosive Component)

It is preferable that an anticorrosive component applied to the treatment liquid of the present invention is a nitrogen-containing organic compound or an oxygen-containing organic compound.

Examples of the nitrogen-containing organic compound include compounds having an amino group ($NR^N_2$), an imino group ($NR^N$), an ammonium group ($NR^M_4{}^+$), a pyridinium group ($C_5NR^{M+}$), and an imidazolidinium group ($C_3N_2R^M_2{}^+$). Here, $R^N$ represents a hydrogen atom, an alkyl group having 1 to 12 carbon atoms (the number of carbon atoms is preferably in a range of 1 to 6 and more preferably in a range of 1 to 3), an alkenyl group having 2 to 12 carbon atoms (the number of carbon atoms is preferably in a range of 2 to 6 and more preferably 2 or 3), or an aryl group having 6 to 14 carbon atoms (the number of carbon atoms is preferably in a range of 6 to 10). $R^M$ represents an alkyl group having 1 to 12 carbon atoms (the number of carbon atoms is preferably in a range of 1 to 6 and more preferably in a range of 1 to 3), an alkenyl group having 2 to 12 carbon atoms (the number of carbon atoms is preferably in a range of 2 to 6 and more preferably 2 or 3), or an aryl group having 6 to 14 carbon atoms (the number of carbon atoms is preferably in a range of 6 to 10).

Examples of the oxygen-containing organic compound include compounds having a hydroxy group (OH), a carboxyl group (COOH), a carbonyl group (CO), an ether group (O), and a group related to a combination of these.

It is preferable that the above-described anticorrosive is a compound represented by any of the following Formulae (1) to (6), (10), and (11) or a compound having a repeating unit represented by any of the following Formula (7) to (9).

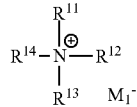  (1)

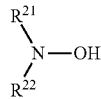  (2)

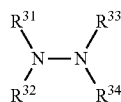  (3)

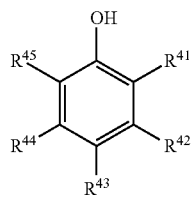  (4)

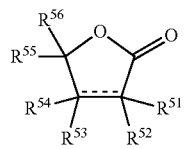  (5)

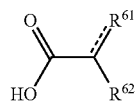  (6)

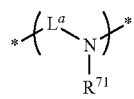  (7)

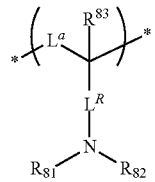  (8)

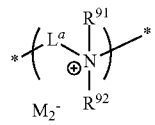  (9)

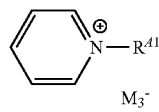  (10)

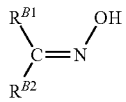  (11)

$R^{11}$ to $R^{14}$, $R^{21}$, $R^{22}$, $R^{31}$ to $R^{34}$, $R^{41}$ to $R^{45}$, $R^{51}$ to $R^{56}$, $R^{61}$, $R^{62}$, $R^{71}$, $R^{81}$ to $R^{83}$, $R^{91}$, $R^{92}$, $R^{A1}$, $R^{B1}$, and $R^{B2}$ each independently represent a group including a hydrogen atom, a carbon atom, an oxygen atom, a sulfur atom, or a nitrogen atom.

$L^a$ represents a linking group. Preferred examples thereof are the same as those defined in the following Formulae (a-1) to (a-8).

$M_1^-$, $M_2^-$, and $M_3^-$ represent a counter anion. Examples thereof include a hydroxide ion and a halogen anion.

The broken line in Formula (5) represents any of a single bond and a double bond. When the broken line represents a double bond, $R^{52}$ and $R^{54}$ are not present.

The broken line in Formula (6) means that $R^{61}$ represents an oxygen atom or a sulfur atom so that the oxygen atom or the sulfur atom may constitute a carbonyl group (C=O) or a thiocarbonyl group (C=S) together with a carbon atom to which the oxygen atom or the sulfur atom is bonded.

$L^R$ represents a single bond or a linking group. Preferred examples thereof are the same as those of $L^b$ described below.

Adjacent substituents may be linked to each other to form a ring. A ring to be formed is not particularly limited, but a 4- to 6-membered ring is preferable and a 4- to 6-membered heteroaliphatic ring or hydrocarbon aliphatic ring is more preferable. Examples of a group that forms a ring include $R^{11}$ to $R^{14}$, $R^{21}$, $R^{22}$, $R^{31}$, $R^{32}$, $R^{33}$, $R^{34}$, $R^{41}$ to $R^{45}$, $R^{51}$ to $R^{56}$, $R^{61}$, $R^{62}$, $R^{81}$, $R^{82}$, $R^{B1}$, and $R^{B2}$.

Formula (1)

It is preferable that $R^{11}$ to $R^{14}$ each independently represent an alkyl group having 1 to 24 carbon atoms (the number of carbon atoms is preferably in a range of 1 to 20, more preferably in a range of 1 to 16, and still more preferably in a range of 1 to 8), an alkenyl group having 2 to 24 carbon atoms (the number of carbon atoms is preferably in a range of 2 to 20, more preferably in a range of 2 to 16, and still more preferably in a range of 2 to 8), or an aryl group having 6 to 14 carbon atoms (the number of carbon atoms is preferably 6 to 10). At this time, it is preferable that at least one of $R^{11}$ to $R^{14}$ has 2 or more carbon atoms. When a compound of Formula (1) is tetraalkyl ammonium hydroxide, examples thereof include tetramethyl ammonium hydroxide (TMAH), but, as described above, tetraalkyl ammonium hydroxide having 5 or more carbon atoms, which has more carbon atoms that that of TMAH, is preferable, tetraalkyl ammonium hydroxide having 8 or more carbon atoms is more preferable, tetraalkyl ammonium hydroxide having 12 or more carbon atoms is still more preferable, and tetraalkyl ammonium hydroxide having 16 or more carbon atoms is particularly preferable. This is because tetraalkyl ammonium hydroxide is preferably hydrophobic in the relationship between tetraalkyl ammonium hydroxide and components included in an organic material-containing layer such as a modified resist, a residue, and the like. Moreover, in a developer described below, tetramethyl ammonium hydroxide is also used as an alkali component and, in this case, an anticorrosive component can be defined as a component other than tetramethyl ammonium hydroxide.

The alkyl group, the alkenyl group, and the aryl group described above may further have a substituent and examples of an optional substituent are the same as those of the substituent T described below. Among the examples, a hydroxy group, a carboxyl group, a sulfanyl group, an acyl group, an alkoxy group, and an amino group, defined in the examples of the substituent T, are preferable. The same applies to the following Formulae (2) to (11).

Formula (2)

It is preferable that $R^{21}$ and $R^{22}$ each independently represent a hydrogen atom, an alkyl group having 1 to 12 carbon atoms (the number of carbon atoms is preferably in a range of 1 to 6 and more preferably in a range of 1 to 3), an alkenyl group having 2 to 12 carbon atoms (the number of carbon atoms is preferably in a range of 2 to 6 and more preferably 2 or 3), an aryl group having 6 to 14 carbon atoms (the number of carbon atoms is preferably 6 to 10), an acyl group having 1 to 12 carbon atoms (the number of carbon atoms is preferably in a range of 1 to 6 and more preferably in a range of 1 to 3), an alkoxy group having 1 to 12 carbon atoms (the number of carbon atoms is preferably in a range of 1 to 6 and more preferably in a range of 1 to 3), an amino carbonyl group [carbamoyl group]($NR^N_2CO$), a hydrazino group ($NR^N$—$NR^N_2$), a hydrazinocarbonyl group (CO—$NR^N$—$NR^N_2$), or C($NR^N$)$NR^N_2$. $R^{21}$ and $R^{22}$ may be linked to each other to form a ring as described above. Among the structures of the ring, it is preferable to employ a structure represented by the following Formula (2-1) when a ring is formed.

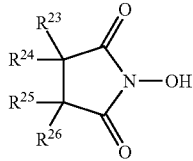

(2-1)

$R^{23}$ to $R^{26}$ each independently represent a hydrogen atom or a substituent. Examples of the substituent include an alkyl group having 1 to 12 carbon atoms (the number of carbon atoms is preferably in a range of 1 to 6 and more preferably in a range of 1 to 3), an alkenyl group having 2 to 12 carbon atoms (the number of carbon atoms is preferably in a range of 2 to 6 and more preferably 2 or 3), and an aryl group having 6 to 14 carbon atoms (the number of carbon atoms is preferably in a range of 6 to 10). $R^{23}$ to $R^{26}$ may be linked to each other and form a ring. For example, it is preferable that a benzene ring is formed to have a phthalimide structure.

Formula (3)

It is preferable that $R^{31}$ to $R^{34}$ have the same definitions as those for $R^{21}$ and $R^{22}$ (a hydrogen atom or a specific substituent). It is preferable that Formula (3) is represented by the following Formula (3-1).

(3-1)

$$\begin{array}{c} H \\ \diagdown \\ N-N \\ \diagup \quad \diagdown \\ H \quad H \end{array} \quad T^1$$

(T1)

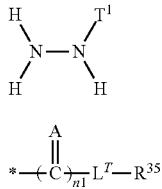

In Formula (3-1), a substituent $T^1$ is a substituent of Formula (T1).

In Formula (T1), A represents an oxygen atom (O), a sulfur atom (S), or an imino group ($NR^N$). nI represents 0 or 1. $L^T$ represents a single bond, an alkylene group having 1 to 12 carbon atoms (the number of carbon atoms is preferably in a range of 1 to 6 and more preferably in a range of 1 to 3), an alkenylene group (the number of carbon atoms is preferably in a range of 2 to 6 and more preferably 2 or 3), or an alkylene group (the number of carbon atoms is preferably in a range of 2 to 6 and more preferably 2 or 3).

$R^{35}$ represents a hydroxy group, a carboxyl group, or an ester thereof [alkoxycarbonyl group](the number of carbon atoms of the ester is preferably in a range of 1 to 6), a sulfanyl group, an alkyl group (the number of carbon atoms is in a range of 1 to 24, more preferably in a range of 1 to 12, and particularly preferably in a range of 1 to 6), an alkenyl group (the number of carbon atoms is in a range of 2 to 24, more preferably in a range of 2 to 12, and particularly preferably in a range of 2 to 6), an alkynyl group (the number of carbon atoms is in a range of 2 to 24, more preferably in a range of 2 to 12, and particularly preferably in a range of 2 to 6), an aryl group (the number of carbon atoms is in a range of 6 to 24, more preferably in a range of 6 to 14, and particularly preferably in a range of 6 to 10), an alkoxy group (the number of carbon atoms is in a range of 1 to 24, more preferably in a range of 1 to 12, and particularly preferably in a range of 1 to 6), an acyl group (the number of carbon atoms is in a range of 1 to 24, more preferably in a range of 1 to 12, and particularly preferably in a range of 1 to 6), an amino group ($NR^N_2$), a hydrazino group ($NR^N$—$NR^N_2$), or a hydradinocarbonyl group (CO—$NR^N$—$NR^N_2$).

Formula (4)

It is preferable that $R^{41}$ to $R^{45}$ each independently represent a hydrogen atom, a hydroxy group, a carboxyl group, an alkyl group having 1 to 12 carbon atoms (the number of carbon atoms is preferably in a range of 1 to 6 and more preferably in a range of 1 to 3), an alkenyl group having 2 to 12 carbon atoms (the number of carbon atoms is preferably in a range of 2 to 6 and more preferably 2 or 3), or an aryl group having 6 to 14 carbon atoms (the number of carbon atoms is preferably in a range of 6 to 10). The carboxyl group may be an ester thereof [alkoxycarbonyl group](the number of carbon atoms of the ester is preferably in a range of 2 to 6). It is preferable that at least one of $R^{41}$ to $R^{45}$ represents a carboxyl group or an ester thereof. Further, it is preferable that at least one of $R^{41}$ to $R^{45}$ represents a hydroxy group.

Formula (5)

It is preferable that $R^{51}$ to $R^{56}$ each independently represent a hydrogen atom, a hydroxy group, a carboxyl group, an alkyl group having 1 to 12 carbon atoms (the number of carbon atoms is preferably in a range of 1 to 6 and more preferably in a range of 1 to 3), an alkenyl group having 2 to 12 carbon atoms (the number of carbon atoms is preferably in a range of 2 to 6 and more preferably 2 or 3), or an aryl group having 6 to 14 carbon atoms (the number of carbon atoms is preferably in a range of 6 to 10). The carboxyl group may be an ester thereof [alkoxycarbonyl group](the number of carbon atoms of the ester is preferably in a range of 2 to 6). It is preferable that Formula (5) is represented by the following Formula (5-1).

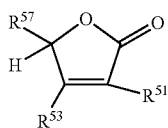
(5-1)

In Formula (5-1), it is preferable that $R^{57}$ represents an alkyl group (the number of carbon atoms is preferably in a range of 1 to 12, more preferably in a range of 1 to 6, and still more preferably in a range of 1 to 3) having a hydroxy group. The hydroxyl group may be esterified. As an example of $R^{57}$, —CH(OH)—CH$_2$—O-T$^1$ is exemplified. T$^1$ has the same definition as that in Formula 3-1 above.

Formula (6)

It is preferable that $R^{61}$ and $R^{62}$ each independently represent a hydrogen atom, a hydroxyl group, a carboxyl group, an alkyl group having 1 to 12 carbon atoms (the number of carbon atoms is preferably in a range of 1 to 6 and more preferably in a range of 1 to 3), an alkenyl group having 2 to 12 carbon atoms (the number of carbon atoms is preferably in a range of 2 to 6 and more preferably 2 or 3), an aryl group having 6 to 14 carbon atoms (the number of carbon atoms is preferably in a range of 6 to 10), or an oxygen atom forming a carbonyl group. It is preferable that Formula (6) is represented by the following Formula (6-1).

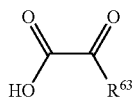
(6-1)

In Formula (6-1), it is preferable that $R^{63}$ represents a hydrogen atom, a hydroxy group, or an alkyl group (the number of carbon atoms is preferably in a range of 1 to 12, more preferably in a range of 1 to 6, and still more preferably in a range of 1 to 3) having a hydroxy group.

Formula (7)

It is preferable that $R^{71}$ represents a hydrogen atom, an alkyl group having 1 to 12 carbon atoms (the number of carbon atoms is preferably in a range of 1 to 6 and more preferably in a range of 1 to 3), an alkenyl group having 2 to 12 carbon atoms (the number of carbon atoms is preferably in a range of 2 to 6 and more preferably 2 or 3), or an aryl group having 6 to 14 carbon atoms (the number of carbon atoms is preferably in a range of 6 to 10).

Formula (8)

It is preferable that $R^{81}$ and $R^{82}$ represent a hydrogen atom, an alkyl group having 1 to 12 carbon atoms (the number of carbon atoms is preferably in a range of 1 to 6 and more preferably in a range of 1 to 3), an alkenyl group having 2 to 12 carbon atoms (the number of carbon atoms is preferably in a range of 2 to 6 and more preferably 2 or 3), or an aryl group having 6 to 14 carbon atoms (the number of carbon atoms is preferably in a range of 6 to 10). $R^{81}$ and $R^{82}$ may be bonded to each other or condensed to each other to form a ring.

It is preferable that $R^{83}$ represents a methyl group, an ethyl group, or a propyl group.

Formula (9)

It is preferable that $R^{91}$ and $R^{92}$ represent a hydrogen atom, an alkyl group having 1 to 12 carbon atoms (the number of carbon atoms is preferable in a range of 1 to 6 and more preferably in a range of 1 to 3), an alkenyl group having 2 to 12 carbon atoms (the number of carbon atoms is preferably in a range of 2 to 6 and more preferably 2 or 3), or an aryl group having 6 to 14 carbon atoms (the number of carbon atoms is preferably in a range of 6 to 10).

Formula (10)

It is preferable that $R^{41}$ represents an alkyl group having 1 to 24 carbon atoms (the number of carbon atoms is preferable in a range of 1 to 20 and more preferably in a range of 1 to 16), an alkenyl group having 2 to 24 carbon atoms (the number of carbon atoms is preferably in a range of 2 to 20 and more preferably in a range of 2 to 16), or an aryl group having 6 to 14 carbon atoms (the number of carbon atoms is preferably in a range of 6 to 10).

Formula (11)

It is preferable that $R^{B1}$ and $R^{B2}$ each independently represent an alkyl group having 1 to 12 carbon atoms (the number of carbon atoms is preferable in a range of 1 to 6 and more preferably in a range of 1 to 3), an alkenyl group having 2 to 12 carbon atoms (the number of carbon atoms is preferably in a range of 2 to 6 and more preferably 2 or 3), an aryl group having 6 to 14 carbon atoms (the number of carbon atoms is preferably in a range of 6 to 10) or an amino group (NR$^N{}_2$).

The compounds represented by Formulae (7) to (9) may be formed of only repeating units in the formulae or may have other repeating units.

It is preferable that a compound represented by any of Formulae (7) to (9) is selected from compounds having repeating units represented by the following Formulae (a-1) to (a-8).

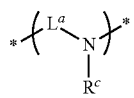
(a-1)

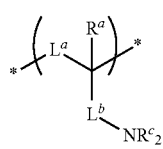
(a-2)

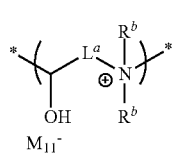
(a-3)

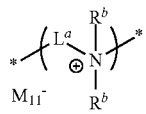
(a-4)

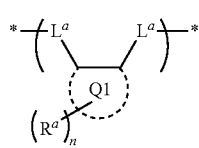
(a-5)

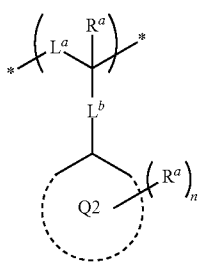
(a-6)

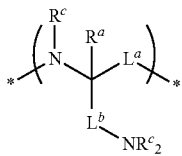
(a-7)

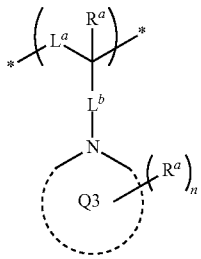
(a-8)

$R^a$ $R^1$ represents a hydrogen atom, an alkyl group (the number of carbon atoms is preferably 1 to 12, more preferably in the range of 1 to 6, and particularly preferably in the range of 1 to 3), an alkenyl group (the number of carbon atoms is preferably 2 to 12 and more preferably in the range of 2 to 6), an aryl group (the number of carbon atoms is preferably 6 to 22 and more preferably in the range of 6 to 14), or a heterocyclic group (the number of carbon atoms is preferably 2 to 12 and more preferably in the range of 2 to 6). Among these, it is preferable that $R^a$ represents a hydrogen atom or a methyl group. In addition, an alkyl group in the present specification includes an aralkyl group.

$R^b$ $R^b$ represents an alkyl group (the number of carbon atoms is preferably 1 to 12, more preferably in the range of 1 to 6, and particularly preferably in the range of 1 to 3) or an alkenyl group (the number of carbon atoms is preferably in the range of 2 to 12 and more preferably in the range of 2 to 6). Among these, it is preferable that $R^b$ represents a methyl group or an ethyl group.

$L^a$ $L^a$ represents a linking group. $L^a$ represents an alkylene group (the number of carbon atoms is preferably in the range of 1 to 12, more preferably in the range of 1 to 6, and particularly preferably in the range of 1 to 3), a carbonyl group, an imino group (the number of carbon atoms is preferably in the range of 0 to 6 and more preferably in the range of 0 to 3), an arylene group (the number of carbon atoms is preferably in the range of 6 to 22 and more preferably in the range of 6 to 14), a heterocyclic group (the number of carbon atoms is preferably in the range of 1 to 12 and more preferably in the range of 2 to 5), or a combination of these. Among these, an alkylene group or a carbonyl group is preferable, a methylene group, an ethylene group, a propylene group, or a carbonyl group is more preferable, a methylene group or an ethylene group is still more preferable, and a methylene group is particularly preferable.

$L^b$ $L^b$ represents a single bond, an alkylene group (the number of carbon atoms is preferably in the range of 1 to 12, more preferably in the range of 1 to 6, and particularly preferably in the range of 1 to 3), a carbonyl group, an imino group ($NR^N$) (the number of carbon atoms is preferably in the range of 0 to 6 and more preferably in the range of 0 to 3), an arylene group (the number of carbon atoms is preferably in the range of 6 to 22 and more preferably in the range of 6 to 14), a heterocyclic group (the number of carbon atoms is preferably in the range of 1 to 12 and more preferably in the range of 2 to 5), or a combination of these. Among these, a single bond, a methylene group, an ethylene group, a propylene group, or a carbonyl group is preferable and a single bond, a methylene group, or an ethylene group is more preferable.

$R^c$ $R^c$ represents a hydrogen atom or an alkyl group (the number of carbon atoms is preferably in the range of 1 to 12, more preferably in the range of 1 to 6, and particularly preferably in the range of 1 to 3). Among these, it is preferable that $R^c$ represents a hydrogen atom or a methyl group. In Formula (a-1), $R^c$ may represent a graft type polymer formed by introducing a polymer chain to this site or a polymer constituting a mesh network.

n n represents an integer of 0 or greater. The upper limit of n is the number of respective substitutable cyclic structural portions. For example, the number is 4 in a case of the following Formulae (5-1) to (5-4) and the number is 3 in a case of Formulae (6-5) and (6-6).

$M_{11}^-$ $M_{11}^-$ represents a counter anion, and examples thereof include a hydroxide ion or a halogen anion.

A ring Q1 represents a nitrogen-containing heterocycle, and a nitrogen-containing saturated heterocycle is preferable and a 5- or 6-membered ring nitrogen-containing saturated heterocycle is more preferable. Specifically, as the cyclic structure, the following Formulae (5-1) to (5-6) are preferable.

A ring Q2 represents a nitrogen-containing heterocycle, and a nitrogen-containing unsaturated heterocycle is preferable, a 5- or 6-membered ring nitrogen-containing unsaturated heterocycle is more preferable, and a pyrrolyl group, a pyrazolyl group, an imidazolyl group, a triazolyl group, a pyridyl group, or a pyrimidyl group (all of these, bonded at a C-position) is still more preferable. Specifically, as the cyclic structure, the following Formulae (6-1) to (6-11) are preferable.

A ring Q3 represents a nitrogen-containing heterocycle, and a nitrogen-containing unsaturated heterocycle is preferable, a 5-membered ring nitrogen-containing unsaturated heterocycle is more preferable, and a pyrrolyl group, an imidazolyl group, a pyrazolyl group, or a triazolyl group (all of these, bonded at a N-position) is still more preferable. Specifically, as the cyclic structure, the following Formulae 8-1 to 8-3 are preferable.

The symbol "*" in the formulae indicates a binding position.

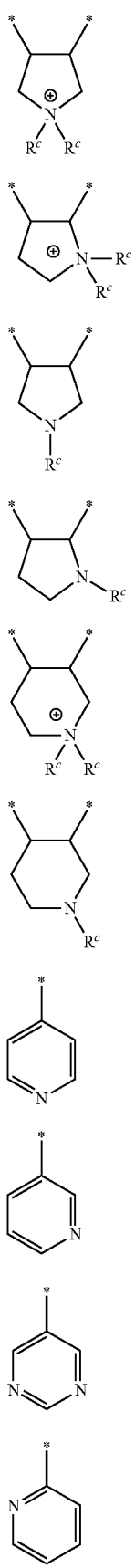
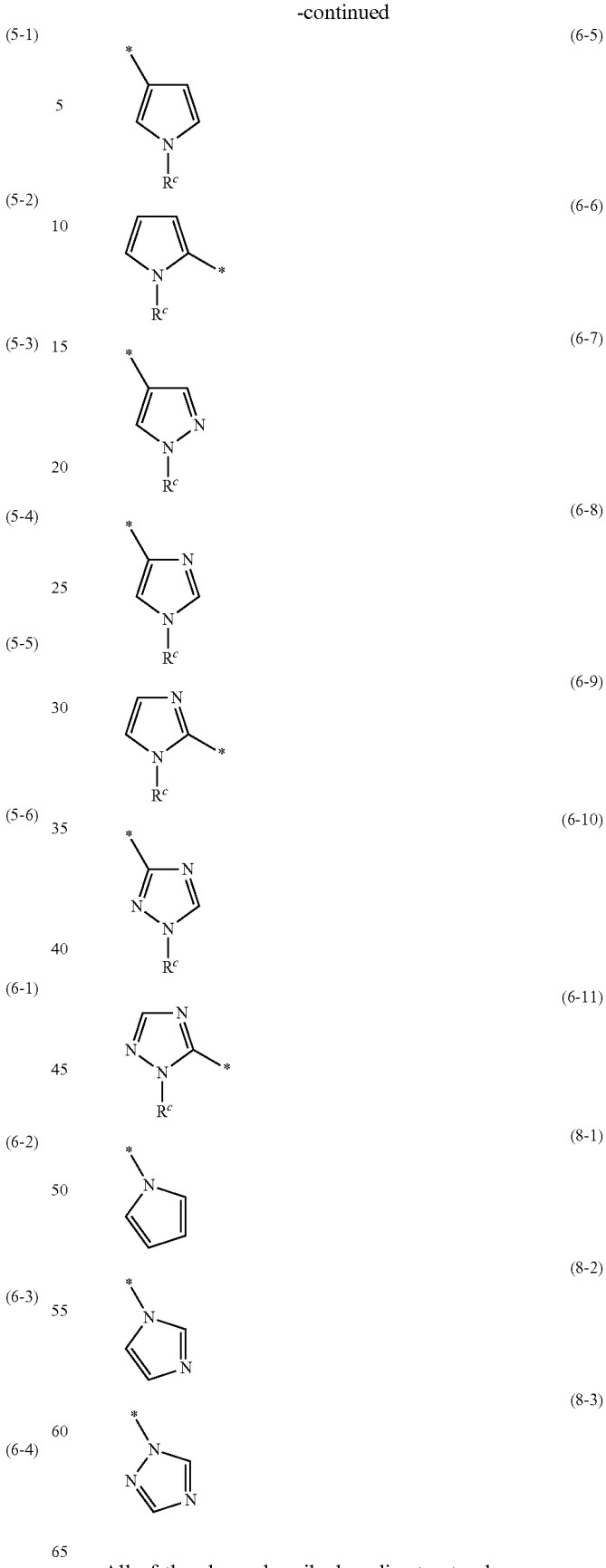
All of the above-described cyclic structural groups may be accompanied by a predetermined number of substituents $R^a$. In the formulae, an onium may become a salt. Further, in Formulae (6-5) to (6-11), the cyclic structural group may indicate an onium or a salt.

A plurality of $R^a$'s, $R^b$'s, $R^c$'s, $L^a$'s, and $L^b$'s are present in a molecule, and these may be the same as or different from each other. The plurality of $R^a$'s, $R^b$'s, and $R^c$'s may be bonded to each other and form a ring. Further, although not particularly noted, substituents or linking groups adjacent to each other may be bonded to each other to form a ring within the range not impairing the effects of the present invention.

Further, it is preferable that the nitrogen-containing organic compound is a compound represented by the following Formula (b).

   (b)

$R^c{}_2N\text{-}[L^d\text{-}N(R^c)]_m\text{-}L^d\text{-}NR^c{}_2$

In the formula, $R^c$ has the same definition as that described above. m represents an integer of 0 or greater, and is preferably 1 or greater, more preferably 2 or greater, and still more preferably 3 or greater. The upper limit is not particularly limited, but is practically 10 or less and more practically 6 or less.

$L^d$ represents an alkylene group (the number of carbon atoms is preferably in the range of 1 to 12, more preferably in the range of 1 to 6, and particularly preferably in the range of 1 to 3), a carbonyl group, an imino group ($NR^N$) (the number of carbon atoms is preferably in the range of 0 to 6 and more preferably in the range of 0 to 3), an arylene group (the number of carbon atoms is preferably in the range of 6 to 22 and more preferably in the range of 6 to 14), a heterocyclic group (the number of carbon atoms is preferably in the range of 1 to 12 and more preferably in the range of 2 to 5), or a combination of these. Among these, an alkylene group is preferable, and a methylene group, an ethylene group, or a propylene group is more preferable.

Further, a plurality of $R^c$'s and $L^d$'s may be the same as or different from each other. The plurality of $R^c$'s and $L^d$'s may be bonded to each other to form a ring.

It is preferable that the above-described nitrogen-containing organic compound is a compound having a repeating unit described below or a compound represented by the following formula. However, the present invention is not limitatively interpreted thereto. In addition, those having a cationic group may have a counter anion. Examples of the counter anion are the same as those of $M_{11}{}^-$ described above.

A-1
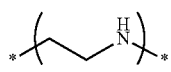

A-2
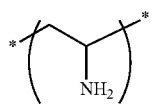

A-3
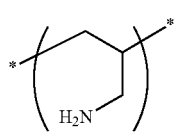

A-4
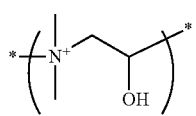

-continued

A-5
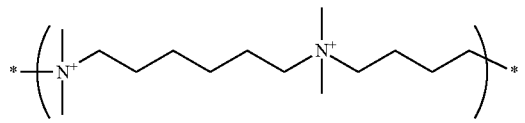

A-6
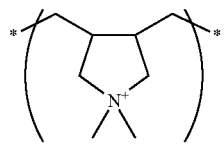

A-7
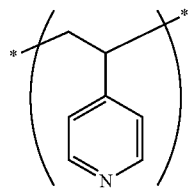

A-8
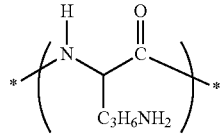

A-9
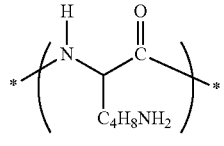

A-10
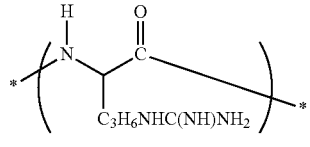

A-11
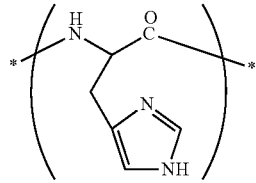

A-12
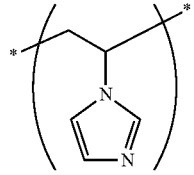

A-13
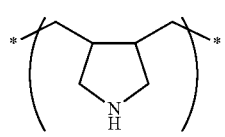

A-14

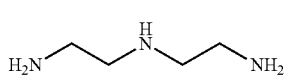
A-15

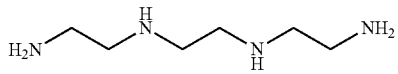
A-16

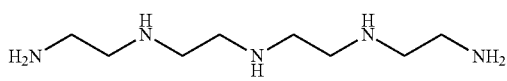
A-17

A-1: polyethyleneimine
A-2: polyvinylamine
A-3: polyallylamine
A-4: dimethylamine-epihydrin-based polymer
A-5: polyhexadimethrine
A-6: polydimethyl diallyl ammonium (salt)
A-7: poly(4-vinylpyridine)
A-8: polyornithine
A-9: polylysine
A-10: polyarginine
A-11: polyhistidine
A-12: polyvinyl imidazole
A-13: polydiallylamine
A-14: polymethyl diallylamine
A-15: diethylenetriamine
A-16: triethylenetetramine
A-17: tetraethylenepentamine
A-18: pentaethylenehexamine In Formula A-1, NH may represent a graft type polymer formed by introducing a polymer chain to this site of a hydrogen atom or a polymer constituting a mesh network.

The concentration of the anticorrosive component may be suitably set according to the utility form (the stripper, the rinsing liquid, or the developer). The preferable blending amount of the above-described anticorrosive components varies depending on an action of the anticorrosive components, and the anticorrosive components are classified into an inhibitor type and a reducing agent type to be described later. The content of an inhibitor-type compound in the treatment liquid is preferably 0.01% by mass or greater, more preferably 0.05% by mass or greater, and particularly preferably 0.1% by mass or greater. The upper limit thereof is preferably 10% by mass or less, more preferably 5% by mass or less, still more preferably 2% by mass or less, and particularly preferably 1% by mass or less. One advantage of the inhibitor-type compound is that the anticorrosive effects are exhibited using a trace amount of the inhibitor-type compound. The content of the reducing agent-type compound in the treatment liquid is preferably 0.5% by mass or greater, more preferably 1% by mass or greater, and particularly preferably 2% by mass or greater. The upper limit thereof is preferably 50% by mass or less, more preferably 30% by mass or less, and particularly preferably 20% by mass or less.

The above-described anticorrosive components may be used alone or in combination of two or more kinds thereof.

When the anticorrosive component is an oligomer or a polymer, it is preferable that the molecular weight thereof is appropriately adjusted. For example, in compounds represented by Formulae (7) to (9), the molecular weight thereof is preferably 500 or greater and more preferably 1,000 or greater. The upper limit thereof is preferably 100,000 or less and more preferably 10,000 or less.

The weight average molecular weight of a polymer compound is measured by gel permeation chromatography (GPC) in terms of standard polystyrene. Basically, using HCL-8200 (manufactured by TOSHO CORPORATION), a method of using a column obtained by connecting three sheets of TSKgel Super AWM-H 6.0 mmID×15.0 cm (manufactured by TOSOH CORPORATION) to each other as a column and 10 mM of LiBr/N-methylpyrrolidone as an eluent; or a method of using a column obtained by connecting TOSOH TSKgel Super HZM-H, TOSOH TSKgel Super HZ4000, and TOSOH TSKgel Super HZ2000 to each other as a column and tetrahydrofuran as an eluent can be used as the measurement method. In this case, an eluent suitable for the type of a polymer may be appropriately selected and then used.

The anticorrosive components can be classified into two types based on the mechanism of the estimated action thereof. The two types are an inhibitor-type compound that is considered to be adsorbed to the surface of a germanium layer and to exhibit the anticorrosive effects and a reducing agent-type compound that suppresses elution of germanium. In the reducing agent type, since germanium has properties of being eluted due to oxidation, it is considered that a function of suppressing the influence thereof in the system is exhibited. With reference to the compounds represented by the above-described Formulae (1) to (11), there is a possibility that the compounds represented by Formulae (1) and (7) to (10) are acted as inhibitor-type compounds. Meanwhile, there is a possibility that the compounds represented by Formulae (2) to (6) and (11) are acted as reducing agent-type compounds.

It is considered that an inhibitor-type compound exhibits a function of protecting Ge because the compound contains a nitrogen (N) atom. This can be confirmed by quantifying the surface of a sample that is allowed to be adsorbed to the surface of Ge through ESCA measurement. When the N/Ge ratio before the treatment is compared to the N/G ratio after the treatment, adsorption of the anticorrosive component is confirmed in the case where the N/Ge ratio after the treatment is greater. As the adsorption amount thereof is larger, this means that a large amount of inhibitor-type compound (anticorrosive component) is adsorbed, which is more preferable in terms of protection of the surface of Ge. It is preferable that the N/Ge ratio is increased by 50% or greater, more preferable that the N/Ge ratio is increased by 100% or greater, and still more preferable that the N/Ge ratio is increased by 200% or greater. The upper limit thereof is not particularly limited, but the upper limit of 1000% or less is practical.

It is understood that the reducing agent-type compound (anticorrosive component) that suppresses elution of germanium increases the surface potential of the surface of Ge to the positive side when added thereto. Since the absolute value thereof changes depending on the environmental conditions, it is difficult to specifically define the potential range thereof, but the potential is assumed to be appropriately changed by the addition of a reducing agent. This can be confirmed by an increase of the surface potential to the positive side when compared to the surface potential before the treatment in a case where the surface potential of the surface of Ge is measured when an additive is used together. As the surface potential is further increased to the positive side, it is understood that Ge is unlikely to be oxidized (enters a reduced state). As a preferred embodiment, it is preferable that the surface potential thereof is increased by 0.2 mV or greater, more preferable that the surface potential thereof is increased by 0.3 mV or greater, and still more preferable that the surface potential thereof is increased by 0.5 mV or greater. The upper limit thereof is not particularly limited, but an upper limit of 1.5 mV or less is practical.

(Stripper)

As a liquid chemical component, it is preferable that an alcohol compound, an aprotic solvent, an organic amine compound, or a combination of these is used in the stripper of the preferred embodiment of the present invention. More specifically, it is preferable that a combination of an alcohol compound and an organic amine compound or a combination of an aprotic solvent and an organic amine compound is used as the stripper.

Alcohol Compound

The alcohol compound includes a wide range of compounds that have carbon and hydrogen in a molecule and one or more hydroxy groups. The number of carbon atoms of the alcohol compound is preferably 1 or greater, more preferably 2 or greater, still more preferably 3 or greater, even still more preferably 4 or greater, even still more preferably 5 or greater, and particularly preferably 6 or greater. The upper limit of the carbon atoms is preferably 24 or less, more preferably 12 or less, and particularly preferably 8 or less. Examples thereof include an ether group-non-containing alcohol compound such as methyl alcohol, ethyl alcohol, 1-propyl alcohol, 2-propyl alcohol, 2-butanol, ethylene glycol, propylene glycol, glycerin, 1,6-hexanediol, cyclohexanediol, sorbitol, xylitol, 2-methyl-2,4-pentanediol, 1,3-butanediol, 1,4-butanediol, methylpentanediol, cyclohexanol, ethylhexanol, benzyl alcohol, or phenylethanol; and an ether group-containing alcohol compound such as alkylene glycol alkyl ether (for example, ethylene glycol monomethyl ether, ethylene glycol monobutyl ether, diethylene glycol, dipropylene glycol, propylene glycol monomethyl ether, diethylene glycol monomethyl ether, triethylene glycol, polyethylene glycol, propylene glycol monomethyl ether, dipropylene glycol monomethyl ether, tripropylene glycol monomethyl ether, diethylene glycol monobutyl ether, or diethylene glycol monobutyl ether), phenoxyethanol, or methoxy methyl butanol.

It is preferable that the alcohol compound is a compound represented by the following Formula (O-1).

$R^{O1}$ $R^{O1}$ represents a hydrogen atom, an alkyl group having 1 to 12 carbon atoms (the number of carbon atoms is preferably in a range of 1 to 6 and more preferably in a range of 1 to 3), or an aryl group having 6 to 14 carbon atoms (the number of carbon atoms is preferably in a range of 6 to 10).

$R^{O2}$ $R^{O2}$ represents a linear or branched alkylene chain having 1 to 12 carbon atoms. When a plurality of $R^{O2}$'s are present, $R^{O2}$'s may be different from each other. The number of carbon atoms of $R^{O2}$ is preferably in a range of 2 to 10, more preferably in a range of 2 to 6, and still more preferably in a range of 2 to 4.

n n represents an integer of 0 to 6. When n represents an integer of 2 or greater, a plurality of $R^{O2}$'s may be different from each other. Here, when n represents an integer of 0, $R^{O1}$ does not represent a hydrogen atom.

It is preferable that the alcohol compound is a compound represented by the following Formula (O-2).

$R^{O3}$ represents a cyclic structural group which may have a substituent. The cyclic structural group may be a hydrocarbon aromatic group, a heterocyclic aromatic group, a cyclic aliphatic group, or a cyclic heteroaliphatic group. Examples of the hydrocarbon aromatic group include an aryl group having 6 to 14 carbon atoms (an aryl group having 6 to 10 carbon atoms is preferable and a phenyl group is more preferable). Examples of the cyclic aliphatic group include a cyclic alkyl group having 6 to 14 carbon atoms (a cyclic alkyl group having 6 to 10 carbon atoms is preferable and a cyclohexyl group is more preferable). Examples of a heterocycle are the same as those of a substituent T described below. Further, examples of a substituent which may be included in a cyclic structural group are the same as those of the substituent T described below.

$L^{O1}$ represents a single bond, O, CO, $NR^N$, S, or a combination of these. Among these, a single bond, CO, or O is preferable and a single bond or O is more preferable.

$R^{O4}$ represents an alkylene group (the number of carbon atoms is preferably in a range of 1 to 12, more preferably in a range of 1 to 6, and particularly preferably in a range of 1 to 3), an arylene group (the number of carbon atoms is preferably in a range of 6 to 14 and more preferably in a range of 6 to 10), or an aralkyl group (the number of carbon atoms is preferably in a range of 7 to 15 and more preferably in a range of 7 to 11).

The content of the alcohol compound in the stripper is preferably 20% by mass or greater, more preferably 30% by mass or greater, and still more preferably 40% by mass or greater. The upper limit thereof is preferably 90% by mass or less, more preferably 80% by mass or less, and still more preferably 70% by mass or less. When the content thereof is adjusted to be in the above-described range, desirable anti-corrosive effects and release properties of the organic material-containing layer can be obtained, which is preferable.

The above-described alcohol compound may be used alone or in combination of two or more kinds thereof.

The C Log P value of the alcohol compound is preferably −0.5 or greater, more preferably 0 or greater, still more preferably 0.3 or greater, and even still more preferably 0.5 or greater. The upper limit thereof is not particularly limited, but is practically 5 or less. Examples of the C Log P values of several compounds are shown below.

| | |
|---|---|
| 2-methyl-2,4-pentanediol | 0.17 |
| Benzyl alcohol | 1.06 |
| 2-phenylethanol | 1.56 |
| 2-phenoxyethanol | 1.19 |
| 3-methoxy-3-methyl-1-butanol | 0.63 |
| 2-ethylhexanol | 2.82 |
| Cyclohexanol | 1.49 |
| Ethylene glycol | −1.36 |
| Propylene glycol | −0.92 |

An octanol-water partition coefficient (log P value) can be typically measured according to a flask infiltration method described in JIS Japanese Industrial Standards Z7260-107 (2000). Further, the octanol-water partition coefficient (log P value) can be estimated by a calculating chemical method or an empirical method instead of actual measurement. It is known that a Crippen's fragmentation method (J. Chem. Inf. Comput. Sci., 27, 21 (1987)), a Viswanadhan's fragmentation method (J. Chem. Inf. Comput. Sci., 29, 163 (1989)), Broto's fragmentation method (Eur. J. Med. Chem.—Chim. Theor., 19, 71 (1984)), or the like is used as the calculation method thereof. In the present invention, the Crippen's fragmentation method (J. Chem. Inf. Comput. Sci., 27, 21 (1987)) is used.

The C log P value is obtained by calculating a common logarithm log P of a partition coefficient P to 1-octanol and water. A known method or known software can be used for calculating the C log P value, but, unless otherwise noted, a system from Daylight Chemical Information System, Inc. and a C log P program incorporated in PCModels are used in the present invention.

Aprotic Solvent

A polar aprotic solvent is preferable as an aprotic solvent, and specific examples thereof include dimethyl sulfoxide, sulfolane, ethylene glycol monomethyl ether, diethylene glycol monomethyl ether, propylene glycol monomethyl ether, propylene glycol dimethyl ether, propylene glycol mono-n-butyl ether, dipropylene glycol monomethyl ether, dipropylene glycol dimethyl ether, and dipropylene glycol mono-n-butyl ether. Among these, dimethyl sulfoxide (DMSO) is preferable.

The content of the aprotic solvent in the stripper is preferably 20% by mass or greater, more preferably 30% by mass or greater, and still more preferably 40% by mass or greater. The upper limit thereof is preferably 90% by mass or less, more preferably 80% by mass or less, and still more preferably 70% by mass or less. When the content thereof is adjusted to be in the above-described range, desirable anti-corrosive effects and release properties of the organic material-containing layer can be obtained, which is preferable.

The above-described aprotic solvent may be used alone or in combination of two or more kinds thereof.

(Organic Amine Compound)

Organic amine compounds include a compound including a primary amine, a secondary amine, and a tertiary amine or salts thereof. A carbamoyl group or a salt thereof is to be included therein. An ammonium group includes a quaternary ammonium group or a salt thereof. Here, it is preferable that an organic group of the organic amine compound is a hydrocarbon group, and examples thereof include an alkane residue (typically an alkyl group, but the alkane residue may be a divalent or higher valent group, the same applies to other residues), an alkene residue, an aryl residue, or a combination of these. The number of carbon atoms of the organic group is 1 or greater, and the upper limit thereof is practically 16 or less. It is preferable that the organic amine compound is an amino alcohol compound (the number of carbon atoms is preferably in a range of 1 to 16, more preferably in a range of 1 to 12, and still more preferably in a range of 1 to 6) having an amino group and a hydroxy group in a molecule.

As the organic amine compound, a compound represented by any of the following Formulae (P-1) to (P-3) is exemplified.

$$R^{P1}-NH_2 \quad (P\text{-}1)$$

$$R^{P1}-NH\diagdown_{R^{P3}} \quad (P\text{-}2)$$

$$R^{P4}-N-R^{P6} \atop | \atop R^{P5} \quad (P\text{-}3)$$

In the formula, $R^{P1}$ to $R^{P6}$ each independently represent an alkyl group (the number of carbon atoms is preferably in a range of 1 to 12, more preferably in a range of 1 to 6, and particularly preferably in a range of 1 to 3), an alkenyl group (the number of carbon atoms is preferably in a range of 2 to 12, more preferably in a range of 2 to 6, and particularly preferably 2 or 3), an alkynyl group (the number of carbon atoms is preferably in a range of 2 to 12, more preferably in a range of 2 to 6, and particularly preferably 2 or 3), and an aryl group (the number of carbon atoms is preferably in a range of 6 to 14 and more preferably in a range of 6 to 10). In this case, at least one of $R^{P1}$ to $R^{P6}$ in a molecule includes a hydroxy group.

The alkyl group, the alkenyl group, and the aryl group described above may further have a substituent, and examples of an optional substituent are the same as those of a substituent T described below. Among the examples, a hydroxy group, a carboxyl group, a sulfanyl group, an acyl group, and an alkoxy group, defined in the examples of the substituent T, are preferable. The description here is the same as described above.

In the present invention, it is particularly preferable that a primary amine of Formula (P-1) is used.

When $R^{P1}$ to $R^{P6}$ include an alkyl group, an alkenyl group, and an alkynyl group, a hetero linking group (Ly: S, O, CO, or $NR^N$) may be interposed. When an alkyl group or an alkenyl group having a hydroxy group has a hetero linking group, a group of Formula P-4 is exemplified as a specific structure thereof.

$$\text{OH}-R^{P7}\text{-Ly-}R^{P8}-* \quad \text{Formula (P-4)}$$

$R^{P7}$ and $R^{P8}$ represent an alkylene group having 1 to 12 carbon atoms (the number of carbon atoms is preferably in a range of 1 to 6 and more preferably in a range of 1 to 3) or an alkenylene group having 2 to 12 carbon atoms (the number of carbon atoms is preferably in a range of 2 to 6 and more preferably 2 or 3). The symbol "*" represents a binding site.

It is preferable that the organic amine compound is selected from monoethanolamine (2-aminoethanol) (MEA), diethanolamine (DEA), N-methylethanolamine (NMEA), N,N-dimethylethanolamine (DMMEA), N-methyldiethanolamine (DEMEA), aminoethylethanolamine (AEMEA), N,N-dimethylaminoethyl ethanolamine (DMAEMEA), aminoethoxy ethanol (AEE), N,N-dimethylamino ethoxy ethanol (DMAEE), and propanolamine (MPA).

The content of the organic amine compound in the stripper is preferably 5% by mass or greater, more preferably 10% by mass or greater, and still more preferably 15% by mass. The upper limit thereof is preferably 90% by mass or less, more preferably 80% by mass or less, and more preferably 70% by mass or less. When the content thereof is adjusted to be in the above-described range, desirable anti-corrosive effects and release properties of the organic material-containing layer can be obtained, which is preferable.

In terms of the relationship between the aprotic solvent and the alcohol compound, the content of the organic amine compound is preferably 10 parts by mass or greater, more preferably 20 parts by mass or greater, and particularly preferably 30 parts by mass or greater with respect to 100 parts by mass of the aprotic solvent or the alcohol compound. The upper limit thereof is preferably 200 parts by mass or less, more preferably 150 parts by mass or less, and particularly preferably 130 parts by mass or less.

The above-described organic amine compound may be used alone or in combination of two or more kinds thereof.

(Rinsing Liquid)

Aqueous Medium

When the treatment liquid of the present invention is used as a rinsing liquid, it is preferable that the liquid chemical component is water. As water (aqueous medium), an aqueous medium including a dissolved component may be used within the range not impairing the effects of the present invention. Alternatively, the aqueous medium may include a small amount of inevitable mixed component. As the water, water subjected to a purification treatment such as distilled water, ion-exchange water, or ultrapure water is preferable and ultrapure water used for manufacturing a semiconductor is particularly preferable.

The amount of water in the rinsing liquid is preferably 70% by mass or greater, more preferably 80% by mass or greater, and still more preferably 90% by mass or greater. In consideration of addition of anticorrosive components, the upper limit thereof is preferably less than 100% by mass. When the amount thereof is in the above-described range, desirable rinsing effects can be obtained, which is preferable.

(Developer)

When the treatment liquid is used as the developer, it is preferable that an alkali component is used as a liquid chemical component and water is used as a medium.

Alkali Component

An alkali component is not particularly limited as long as the alkali component is a substance that makes the system of the aqueous medium alkaline. The term "alkali" needs to be defined in the widest sense, and can be defined as a base according to the definition of the Arrhenius. An alkali compound may be an organic base or an inorganic base.

As the inorganic base, a compound represented by the following Formula (I-1) is exemplified.

$$M(OH)_{nI} \quad (I\text{-}1)$$

M represents an alkali metal (preferably lithium, sodium, or potassium), an alkaline earth metal (preferably magnesium or calcium), $NH_4$, $NR^N{}_2$ ($R^N$ has the same definition as that described above, and it is preferable that $R^N$ represents a hydrogen atom or an alkyl group having 1 to 6 carbon atoms), a transition element (preferably manganese, zinc, or copper), or a rare earth element (preferably lanthanum). nI represents an integer and preferably an integer of 1 to 3. Moreover, nI is naturally determined by an element of M or an atom group. When M represents $NH_4$ or $NR^N{}_2$, nI represents 1 and the compounds are respectively ammonium hydroxide ($NF_4OH$) (noted as $NH_3$ in the examples) and hydroxylamine ($NH_2OH$). nI represents 1 when M represents an alkali metal and nI represents 2 when M represents an alkaline earth metal. When M represents another transition element or rare earth element, nI may be suitably determined according to the valence of the element. As the inorganic base, hydrazine is further exemplified and defined by the following Formula (H-1) of hydrazines.

Examples of the inorganic base include alkali metal salts (such as KOH, LiOH, and NaOH), alkaline earth metal salts (such as $Ca(OH)_2$ and $Mg(OH)_2$), an ammonium hydroxide salt, the hydrazines described below, and hydroxylamine. Moreover, when M represents $NR^N{}_2$, nI represents 1 and OH thereof may be esterified. Examples thereof include an alkyl ester having 1 to 6 carbon atoms, and in a case where $R^N$ represents a methyl group and a methyl ester is formed, the compound is N,O-dimethylhydroxylamine.

Examples of the organic base include an organic amine compound and an organic onium salt. As the organic amine compound, a compound represented by any of Formulae (P-1) to (P-3) is exemplified.

Examples of the organic onium salt include a nitrogen-containing onium salt (such as quaternary ammonium salt), a phosphorus-containing onium salt (such as quaternary phosphonium salt), and a sulfur-containing onium salt (such as $SRy_3M$: Ry represents an alkyl group having 1 to 6 carbon atoms and M represents a counter anion). Among these, a nitrogen-containing onium salt (a quaternary ammonium salt, a pyridinium salt, a pyrazolium salt, or an imidazolium salt) is preferable. It is preferable that the alkali component is a quaternary ammonium hydroxide.

As the organic onium salt, a compound represented by the following Formula (O-4) or (O-5) is preferable.

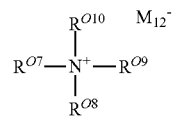

(O-4)

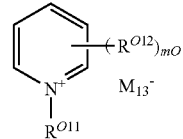

(O-5)

In Formula (O-4), $R^{O7}$ to $R^{O10}$ each independently represent an alkyl group having 1 to 20 carbon atoms (the number of carbon atoms is preferably in a range of 1 to 8 and more preferably in a range of 1 to 3), an alkenyl group having 2 to 20 carbon atoms (the number of carbon atoms is preferably in a range of 2 to 8 and more preferably 2 or 3), an alkynyl group having 2 to 20 carbon atoms (the number of carbon atoms is preferably in a range of 2 to 8 and more preferably 2 or 3), an aryl group having 6 to 14 carbon atoms (the number of carbon atoms is preferably in a range of 6 to 10), an aralkyl group having 7 to 15 carbon atoms (the number of carbon atoms is preferably in a range of 7 to 11), and a group represented by the following Formula (y).

$$Y1\text{-}(Ry1\text{-}Y2)my\text{-}Ry2\text{-}* \quad (y)$$

Y1 represents an alkyl group having 1 to 12 carbon atoms (the number of carbon atoms is preferably in a range of 1 to 6 and more preferably in a range of 1 to 3), an alkenyl group having 2 to 12 carbon atoms (the number of carbon atoms is preferably in a range of 2 to 6 and more preferably 2 or 3), an alkynyl group having 2 to 12 carbon atoms (the number of carbon atoms is preferably in a range of 2 to 6 and more preferably 2 or 3), an aralkyl group having 7 to 15 carbon atoms (the number of carbon atoms is preferably in a range of 7 to 11), an aryl group having 6 to 14 carbon atoms (the number of carbon atoms is preferably in a range of 6 to 10), a hydroxy group, and an alkoxy group having 1 to 4 carbon atoms (the number of carbon atoms is preferably in a range of 1 to 6). Y2 represents O, S, CO, $NR^N$ ($R^N$ has the same definition as described above, and it is preferable that $R^N$ represents a hydrogen atom or an alkyl group having 1 to 6 carbon atoms), or a combination of these. Ry1 and Ry2 each independently represent an alkylene group having 1 to 6 carbon atoms, an alkenylene group having 2 to 6 carbon atoms, an alkynylene group having 2 to 6 carbon atoms, an arylene group having 6 to 10 carbon atoms, or a combination of these, my represents an integer of 0 to 6. When my represents an integer of 2 or greater, a plurality of Ry1's and Y2's may be different from each other. Ry1 and Ry2 may further have a substituent T. The symbol "*" represents a binding site.

$M_{12}{}^-$ and $M_{13}{}^-$ represent a counter ion such as a hydroxide ion.

In Formula (O-5). $R^{O11}$ has the same definition as that for $R^{O7}$. $R^{O12}$ is an optional substituent T and preferably has the same definition as that for a substituent $R^N$. mO represents an integer of 0 to 5.

Specifically, tetraalkyl ammonium hydroxide (the number of carbon atoms is preferably in a range of 4 to 25). At this time, the alkyl group may be substituted with an optional substituent (such as a hydroxyl group, an allyl group, or an aryl group) within the range not impairing the effects of the present invention. Moreover, the alkyl group may be linear, branched, or cyclic. Specific examples thereof include tetramethylammonium hydroxide (TMAH), tetraethylammonium hydroxide (TEAH), benzyl trimethyl ammonium hydroxide, ethyl trimethylammonium hydroxide, 2-hydroxyethyl trimethyl ammonium hydroxide, benzyl triethyl ammonium hydroxide, hexadecyl trimethyl ammonium hydroxide, tetrabutylammonium hydroxide (TBAH), tetrahexylammonium hydroxide (THAH), and tetrapropylammonium hydroxide (TPAH). In addition, examples of those having a halogen anion include benzalkonium chloride, benzethonium chloride, methyl benzethonium chloride, cetylpyridinium chloride, cetrimonium, dofanium chloride, tetraethylammonium bromide, didecyl dimethyl ammonium chloride, and domiphen bromide.

It is preferable that the alkali compounds are hydrazines represented by the following Formula (H-1).

$R^{H1}$ and $R^{H2}$ each independently represent a hydrogen atom, an alkyl group having 1 to 6 carbon atoms, an alkenyl group having 2 to 6 carbon atoms, an alkynyl group having 2 to 6 carbon atoms, an aryl group having 6 to 10 carbon atoms, or an aralkyl group having 7 to 15 carbon atoms. Specifically, hydrazine, phenyl hydrazine, methyl hydrazine, 1,2-dimethyl hydrazine, or 1,1-dimethyl hydrazine is preferable.

The concentration of the alkali compound in the developer is preferably 0.1% by mass or greater, more preferably 0.5% by mass or greater, and particularly preferably 1% by mass or greater. The upper limit thereof is preferably 30% by mass or less, more preferably 10% by mass or less, and particularly preferably 5% by mass or less. When the concentration of the alkali component is adjusted to be in the above-described range, it is possible to achieve both of excellent developability and protection properties of germanium.

The above-described alkali component may be used alone or in combination of two or more kinds thereof.

A water-soluble organic solvent may be further added to the treatment liquid of the present invention. As the water-soluble organic solvent, an organic solvent which can be mixed with water at an arbitrary ratio is preferable.

Examples of the water-soluble organic solvent include an alcohol compound solvent such as methyl alcohol, ethyl alcohol, 1-propyl alcohol, 2-propyl alcohol, 2-butanol ethylene glycol, propylene glycol, glycerin, 1,6-hexanediol, cyclohexanediol, sorbitol, xylitol, 2-methyl-2,4-pentanediol, 1,3-butanediol, or 1,4-butanediol, and an ether compound solvent containing alkylene glycol alkyl ether (for example, ethylene glycol monomethyl ether, ethylene glycol monobutyl ether, diethylene glycol, dipropylene glycol, propylene glycol monomethyl ether, diethylene glycol monomethyl ether, triethylene glycol, polyethylene glycol, propylene glycol monomethyl ether, dipropylene glycol monomethyl ether, tripropylene glycol monomethyl ether, diethylene glycol monobutyl ether, or diethylene glycol monobutyl ether).

Among these, an alcohol compound solvent having 2 to 15 carbon atoms or a hydroxy group-containing ether compound solvent having 2 to 15 carbon atoms is preferable, an alcohol compound solvent which includes a plurality of hydroxy groups having 2 to 10 carbon atoms or a hydroxy group-containing ether compound solvent which includes a plurality of hydroxy groups having 2 to 10 carbon atoms is more preferable, and alkylene glycol alkyl ether having 3 to 8 carbon atoms is particularly preferable. The water-soluble organic solvent may be used alone or in combination of two or more kinds thereof. Moreover, in the present specification, a compound having a hydroxy group (—OH) and an ether group (—O—) in a molecule is included in an ether compound (not referred to as an alcohol compound) in principle. When the compound having both of a hydroxy group and an ether group is particularly distinguished from other compounds, the compound is referred to as a hydroxy group-containing ether compound in some cases.

Among these, propylene glycol or dipropylene glycol is particularly preferable. The amount of the water-soluble organic solvent to be added is preferably in a range of 0.1% by mass to 70% by mass and more preferably in a range of 10% by mass to 50% by mass with respect to the total amount of the treatment liquid.

It is preferable that the water-soluble organic solvent is a compound represented by the following Formula (Q-1).

$R^{Q1}$ and $R^{Q2}$ $R^{Q1}$ and $R^{Q2}$ each independently represent a hydrogen atom or an alkyl group having 1 to 5 carbon atoms. Among these, it is preferable that $R^{Q1}$ and $R^{Q2}$ each independently represent an alkyl group having 1 to 5 carbon atoms and more preferable that $R^{Q1}$ and $R^{Q2}$ each independently represent an alkyl group having 1 to 3 carbon atoms.

$R^{Q3}$ $R^{Q3}$ represents a linear or branched alkylene chain having 1 to 4 carbon atoms. When a plurality of $R^{Q3}$'s are present, $R^{Q3}$'s may be different from each other.

n n represents an integer of 1 to 6. When n represents an integer of 2 or greater, a plurality of $R^{13}$'s may be different from each other.

(pH Regulator)

In a treatment liquid of the present invention, a pH regulator may be used in order for the pH thereof to be in a desired range. It is preferable that tetramethylammonium, quaternary ammonium salts such as choline, alkali hydroxides such as potassium hydroxide, alkaline-earth salts, 2-aminoethanol, or an amino compound such as guanidine is used as the pH regulator for the purpose of increasing the pH value. Examples of the pH regulator used to decrease the pH value include inorganic acids such as carbonic acid, hydrochloric acid, nitric acid, sulfuric acid, and phosphoric acid; and organic acids such as formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, and lactic acid.

The amount of the pH regulator to be used is not particularly limited as long as an amount thereof required for adjusting the pH to be in the above-described range is used.

The pH regulator may be used alone or in combination of two or more kinds thereof.

The display of compounds in the present specification (for example, when a compound is referred to by being added at the end of the compound) is used to include the compound itself, a salt thereof, and an ion thereof. Further, the display thereof includes a derivative which is partially changed by being esterified or introducing a substituent within a range in which desired effects can be exhibited.

A substituent (the same applies to a linking group) in which substitution or unsubstitution is not specified in the present specification means that an arbitrary substituent may be included in the group. The same applies to a compound in which substitution or unsubstitution is not specified. As a preferred substituent, the substituent T described below is exemplified.

Examples of the substituent T include the followings.

Examples thereof include an alkyl group (preferably an alkyl group having 1 to 20 carbon atoms such as methyl, ethyl, isopropyl, t-butyl, pentyl, heptyl, 1-ethylpentyl, benzyl, 2-ethoxyethyl, or 1-carboxymethyl), an alkenyl group (preferably, an alkenyl group having 2 to 20 carbon atoms such as vinyl, allyl, or oleyl), an alkynyl group (preferably an alkynyl group having 2 to 20 carbon atoms such as ethynyl, butadiynyl, or phenylethynyl), a cycloalkyl group (preferably a cycloalkyl group having 3 to 20 carbon atoms such as cyclopropyl, cyclopentyl, cyclohexyl, or 4-methylcyclohexyl), an aryl group (preferably an aryl group having 6 to 26 carbon atoms such as phenyl, 1-naphthyl, 4-methoxyphenyl, 2-chlorophenyl, or 3-methylphenyl), a heterocyclic group (preferably a heterocyclic group having 2 to 20 carbon atoms or preferably a heterocyclic ring of a 5- or 6-membered ring having at least one of an oxygen atom, a sulfur atom and a nitrogen atom such as 2-pyridyl, 4-pyridyl, 2-imidazolyl, 2-benzimidazolyl, 2-thiazolyl, or 2-oxazolyl), an alkoxy group (preferably an alkoxy group having 1 to 20 carbon atoms such as methoxy, ethoxy, isopropyloxy, or benzyloxy), an aryloxy group (preferably an aryloxy group having 6 to 26 carbon atoms such as phenoxy, 1-naphthyloxy, 3-methylphenoxy, or 4-methoxyphenoxy), an alkoxycarbonyl group (preferably an alkoxycarbonyl group having 2 to 20 carbon atoms such as ethoxycarbonyl or 2-ethylhexyloxycarbonyl), an amino group (preferably an amino group having 0 to 20 carbon atoms, an alkylamino group having 0 to 20 carbon atoms, or an arylamino group having 0 to 20 carbon atoms such as amino, N,N-dimethylamino, N,N-diethylamino, N-ethylamino, or anilino), a sulfamoyl group (preferably a sulfamoyl group having 0 to 20 carbon atoms such as N,N-dimethylsulfamoyl or N-phenylsulfamoyl), an acyl group (preferably an acyl group having 1 to 20 carbon atoms such as acetyl, propionyl, butyryl, or benzoyl), an acyloxy group (preferably an acyloxy group having 1 to 20 carbon atoms such as acetyloxy or benzoyloxy), a carbamoyl group (preferably a carbamoyl group having 1 to 20 carbon atoms such as N,N-dimethylcarbamoyl or N-phenylcarbamoyl), an acylamino group (preferably an acylamino group having 1 to 20 carbon atoms such as acetylamino or benzoylamino), an alkylthio group (preferably an alkylthio group having 1 to 20 carbon atoms such as methylthio, ethylthio, isopropylthio, or benzylthio), an arylthio group (preferably an arylthio group having 6 to 26 carbon atoms such as phenylthio, l-naphthylthio, 3-methylphenylthio, or 4-methoxyphenylthio), alkyl or an arylsulfonyl group (preferably alkyl or an arylsulfonyl group having 1 to 20 carbon atoms such as methylsulfonyl, ethylsulfonyl, or benzenesulfonyl), and a hydroxyl group, a sulfanyl group, a cyano group, and a halogen atom (such as a fluorine atom, a chlorine atom, a bromine atom, or an iodine atom). Among these, an alkyl group, an alkenyl group, an aryl group, a heterocyclic group, an alkoxy group, an aryloxy group, an alkoxycarbonyl group, an amino group, an acylamino group, a hydroxyl group or a halogen atom is more preferable. Further, an alkyl group, an alkenyl group, a heterocyclic group, an alkoxy group, an alkoxycarbonyl group, an amino group, an acylamino group, or a hydroxyl group is particularly preferable.

Moreover, respective groups exemplified in these substituents T may be further substituted with the above-described substituents T.

When a compound or a substituent and a linking group include an alkyl group, an alkylene group, an alkenyl group, an alkenylene group, an alkynyl group, or an alkynylene group, these may be cyclic, chain-like, linear, or branched and may be substituted or unsubstituted as described above. Moreover, when an aryl group and a heterocyclic group are included, these may be a single ring or a condensed ring and may be substituted or unsubstituted.

In the present specification, each of the technical matters such as the temperature or the thickness including options of substituents or linking groups of compounds can be used in combination even through the lists thereof are respectively and independently described.

Respective substituents defined in the present specification may be substituted through a linking group L described below within the range in which the effects of the present invention are exhibited or the linking group L may exist in the structure thereof. A hetero linking group described below may exist in the structure of, for example, an alkyl group, an alkylene group, an alkenyl group, or an alkenylene group.

Preferred examples of the linking group L include a hydrocarbon linking group [an alkylene group having 1 to 10 carbon atoms (the number of carbon atoms is preferably in a range of 1 to 6 and more preferably in a range of 1 to 3), an alkenylene group having 2 to 10 carbon atoms (the number of carbon atoms is preferably in a range of 2 to 6 and more preferably in a range of 2 to 4), an alkynylene group having 2 to 10 carbon atoms (the number of carbon atoms is preferably in a range of 2 to 6 and more preferably in a range of 2 to 4), an arylene group having 6 to 22 carbon atoms (the number of carbon atoms is preferably in a range of 6 to 10), or a combination of these], a hetero linking group [a carbonyl group (—CO—), a thiocarbonyl group (—CS—), an ether group (—O—), a thioether group (—S—), an imino group (—$NR^N$—), an ammonium linking group (—$NR^N_2{}^+$—), a polysulfide group (the number of S' is in a range of 1 to 8), an imine linking group ($R^N$—N=C< or —N=C($R^N$)—), a sulfonyl group (—$SO_2$—), a sulfinyl group (—SO—), a phosphoric acid linking group (—O—P(OH)(O)—O—), a phosphonic acid linking group (—P(OH)(O)—O—), or a combination of these], or a linking group combining these groups. Moreover, in a case where substituents or linking groups are condensed to each other and form a ring, the above-described hydrocarbon linking groups may form a double bond or a triple bond to be linked to each other. As a ring to be formed, a 5- or 6-membered ring is preferable. A nitrogen-containing 5-membered ring is preferable as a 5-membered ring, and examples of a compound that forms the ring include pyrrole, imidazole, pyrazole, indazole, indole, benzimidazole, pyrrolidine, imidazolidine, pyrazolidine, indoline, carbazole, and derivatives of these. Examples of a 6-membered ring include piperidine, morpholine, piperazine, and derivatives of these. When the 6-membered ring includes an aryl group or a heterocyclic group, the 6-membered ring may be a single ring or a condensed ring and may be substituted or unsubstituted.

$R^N$ has the same definition as that described above.

$R^P$ represents a hydrogen atom, a hydroxyl group, or a substituent. Preferred examples of the substituent include an alkyl group (the number of carbon atoms is preferably in a range of 1 to 24, more preferably in a range of 1 to 12, still more preferably in a range of 1 to 6, and particularly preferably in a range of 1 to 3), an alkenyl group (the number of carbon atoms is preferably in a range of 2 to 24, more preferably in a range of 2 to 12, still more preferably in a range of 2 to 6, and particularly preferably 2 or 3), an alkynyl group (the number of carbon atoms is preferably in a range of 2 to 24, more preferably in a range of 2 to 12, still more preferably in a range of 2 to 6, and particularly preferably 2 or 3), an aralkyl group (the number of carbon atoms is preferably in a range of 7 to 22, more preferably in a range of 7 to 14, and particularly preferably in a range of 7 to 10), an aryl group (the number of carbon atoms is preferably in a range of 6 to 22, more preferably in a range of 6 to 14, and particularly preferably in a range of 6 to 10), an alkoxy group (the number of carbon atoms is preferably in a range of 1 to 24, more preferably in a range of 1 to 12, still more preferably in a range of 1 to 6, and particularly preferably in a range of 1 to 3), an alkenyloxy group (the number of carbon atoms is preferably in a range of 2 to 24, more preferably in a range of 2 to 12, still more preferably in a range of 2 to 6, and particularly preferably 2 or 3), an alkynyloxy group (the number of carbon atoms is preferably in a range of 2 to 24, more preferably in a range of 2 to 12, still more preferably in a range of 2 to 6, and particularly preferably 2 or 3), an aralkyloxy group (the number of carbon atoms is preferably in a range of 7 to 22, more preferably in a range of 7 to 14, and particularly preferably in a range of 7 to 10), and an aryloxy group (the number of carbon atoms is preferably in a range of 6 to 22, more preferably in a range of 6 to 14, and particularly preferably in a range of 6 to 10).

The number of atoms constituting the linking group L is preferably in a range of 1 to 36, more preferably in a range of 1 to 24, still more preferably in a range of 1 to 12, and particularly preferably in a range of 1 to 6. The number of linking atoms of a linking group is preferably 10 or less and more preferably 8 or less. The lower limit thereof is 1 or greater. The number of linking atoms indicates the minimum number of atoms that are positioned in a path connecting predetermined structural units to each other and are involved in the linkage. For example, in a case of —$CH_2$—C(=O)—O—, the number of atoms constituting the linking group is 6, but the number of linking atoms is 3.

Specific examples of a combination of linking groups include an oxycarbonyl group (—OCO—), a carbonate group (—OCOO—), an amide group (—CONH—), a urethane group (—NHCOO—), a urea group (—NHCONH—), a (poly)alkyleneoxy group (—(Lr—O)x-), a carbonyl (poly)oxyalkylene group (—CO—(O—Lr)x-), a carbonyl (poly)alkyleneoxy group (—CO—(Lr—O)x-), a carbonyloxy (poly)alkyleneoxy group (—COO—(Lr—O)x-), a (poly)alkyleneamino group (—(Lr—$NR^N$)x), an alkylene (poly)iminoalkylene group (—Lr—($NR^N$—Lr)x-), a carbonyl (poly)iminoalkylene group (—CO—($NR^N$—Lr)x-), a carbonyl (poly)alkyleneimino group (—CO—(Lr—$NR^N$)x-), a (poly)ester group (such as —(CO—O—Lr)x-, —(O—CO—Lr)x-, —(O—Lr—CO)x-, —(Lr—CO—O)x-, —(Lr—O—CO)x-), and a (poly)amide group (such as —(CO—$NR^N$—Lr)x-, —($NR^N$—CO—Lr)x-, ($NR^N$—Lr—CO)x-, —(Lr—CO—$NR^N$)x-), or —(Lr—$NR^N$—CO)x-). x represents an integer of 1 or greater, preferably an integer of 1 to 500, and more preferably an integer of 1 to 100.

It is preferable that Lr represents an alkenylene group or an alkynylene group. The number of carbon atoms is preferably in a range of 1 to 12, more preferably in a range of 1 to 6, and particularly preferably in a range of 1 to 3 (alkenylene group, the number of carbon atoms is 2 or more in a case of an alkynylene group). A plurality of Lr's. $R^N$'s, $R^P$'s, and x's are not necessarily the same as each other. The direction of the linking group is not limited to the above-described order and the direction thereof may be made according to a predetermined appropriate chemical formula.

(pH)

The pH (25° C.) of the treatment liquid of the present invention is preferably in a range of 5 to 16. The pH of the stripper is preferably 7 or greater and more preferably 10 or greater. The upper limit thereof is preferably 15 or less. When the pH thereof is in the above-described range, it is possible to achieve both of excellent release properties and protection of the Ge-containing layer. The preferable ranges vary for each embodiment described above and can be summarized as shown in the following table. Preferable liquid chemical components and anticorrosive components are summarized for each embodiment. Further, unless otherwise noted, the measurement conditions of the pH value are as described in the examples below.

TABLE A

| Embodiment | Main component | Preferable anticorrosive | Preferable pH | Preferable treatment temperature |
| --- | --- | --- | --- | --- |
| Stripper | Aprotic solvent Organic amine compound | Formulae (1) to (9) Among these, Formulae (2) and (7) are preferable and a combination of Formulae (2) and (7) is more preferable | In a range of 5 to 16 In a range of 7 to 16 In a range of 10 to 15 | In a range of 10° C. to 100° C. In a range of 20° C. to 80° C. In a range of 40° C. to 70° C. |
| Rinsing liquid | Water | Formulae (1) to (9) Among these, Formulae (2) and (7) are preferable and a combination of Formulae (2) and (7) is more preferable | In a range of 5 to 16 In a range of 5 to 10 In a range of 5 to 8 | In a range of 0° C. to 100° C. In a range of 10° C. to 70° C. In a range of 15° C. to 40° C. |

TABLE A-continued

| Embodiment | Main component | Preferable anticorrosive | Preferable pH | Preferable treatment temperature |
|---|---|---|---|---|
| Developer | Alkali component | Formulae (1) to (9) Among these, Formulae (2) and (7) are preferable and a combination of Formulae (2) and (7) is more preferable | In a range of 5 to 16 In a range of 7 to 16 In a range of 10 to 15 | In a range of 0° C. to 100° C. In a range of 10° C. to 70° C. In a range of 15° C. to 40° C. |

Figure 2:
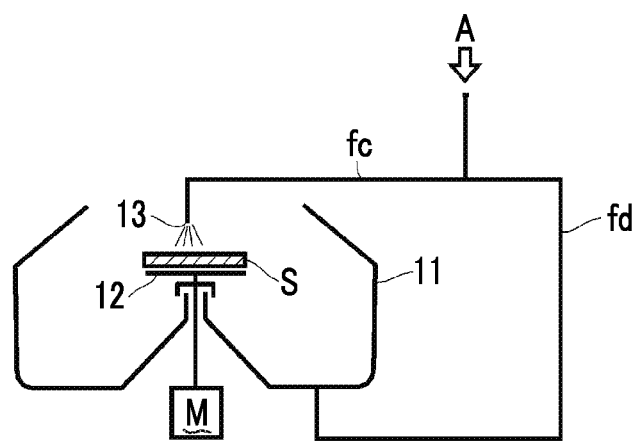
FIG. 2 is a device configuration view illustrating a part of a treatment device according to a preferred embodiment of the present invention.

The manner of application of the treatment liquid is not particularly limited, but it is preferable that the treatment liquid is circulated through channels, ejected or sprayed from an ejection opening, and is brought into contact with the semiconductor substrate. When this process is described with reference to FIG. 2, the prepared treatment liquid is introduced from an introduction port A, transitioned to an ejection opening 13, sprayed from the ejection opening 13, and then applied to the upper surface of a semiconductor substrate S in a treatment container (treatment tank) 11. In the embodiment shown in the same figure, the treatment liquid is transitioned to the ejection opening 13 through a channel fc. A channel fd indicates a returning path for reusing a liquid chemical. It is preferable that the semiconductor substrate S is on a rotary table 12 and rotates along with the rotary table by a rotation driving unit M.

Moreover, in the treatment liquid of the present invention, it is preferable that the amount of impurities in the solution, for example, metals, is small when the usage of the treatment liquid is considered. Particularly, the ion concentration of Na, K, and Ca in the solution is preferably in the range of 1 ppt to 1 ppm (on a mass basis). Further, in the treatment liquid, the number of coarse particles having an average particle diameter of 0.5 μm or greater is preferably 100/cm$^3$ or less and more preferably 50/cm$^3$ or less.

The following aspects can be exemplified as preferable forms of respective liquid chemicals in the present invention.

In a case of the rinsing liquid, it is preferable that the rinsing liquid substantially consists of the above-described anticorrosive component (an oxygen-containing organic compound or a nitrogen-containing organic compound) and water.

In a case of the developer, it is preferable that the developer substantially consists of the above-described anticorrosive component, water, and a quaternary ammonium salt.

In a case of the stripper, it is preferable that (i) the stripper substantially consists of the above-described anticorrosive component, the above-described aprotic solvent, and the above-described organic amine compound or (ii) the stripper substantially consists of the above-described anticorrosive component, the above-described alcohol compound, the above-described organic amine compound, and water.

Here, "substantially" means that inevitable impurities or optional additives may be appropriately contained within the range in which the effects of the present invention are exhibited.

(Container)

The treatment liquid of the present invention fills an arbitrary container to be stored, is transported, and then used as long as corrosion resistance is not a problem. Further, a container whose cleanliness is high and in which impurities are not largely eluted is preferable for the purpose of using the container for a semiconductor. As a usable container, "CLEAN BOTTLE" SERIES (manufactured by ACELLO CORPORATION) or "PURE BOTTLE" (manufactured by KODAMA PLASTICS Co., Ltd.) is exemplified, but the examples are not limited thereto.

[Treatment Conditions]

In the treatment method of the present invention, it is preferable to use a sheet type device. Specifically, a sheet type device which has a treatment tank and in which the semiconductor substrate is transported or rotated in the treatment tank, the treatment liquid is provided (ejection, spray, falling, dropping, or the like) in the treatment tank, and the treatment liquid is brought into contact with the semiconductor substrate is preferable.

Advantages of the sheet type device are as follows: (i) a fresh treatment liquid is constantly supplied and thus reproducibility is excellent and (ii) in-plane uniform treatability is high. Further, a kit obtained by dividing the treatment liquid into plural parts is easily used and, for example, a method of mixing the first and second liquids with each other in line and ejecting the liquid is suitably employed. At this time, a method of mixing the liquids with each other in line and ejecting the mixed solution after the temperature of both of the first liquid and the second liquid is adjusted or the temperature of one of the first liquid and the second liquid is adjusted is preferable. Between the two, adjusting the temperature of both liquids is more preferable. It is preferable that the managed temperature at the time of adjusting the temperature of the line is set to be in the same range as that of the treatment temperature described below.

The sheet type device is preferably provided with a nozzle in the treatment tank thereof and a method of ejecting the treatment liquid to the semiconductor substrate by swinging the nozzle in the plane direction of the semiconductor substrate is preferable. In this manner, deterioration of the liquid can be prevented, which is preferable. Further, the liquid is separated into two or more liquids after the kit is prepared and thus gas or the like is unlikely to be generated, which is preferable.

The treatment temperature varies for each embodiment and preferable treatment temperatures are collectively shown in Table A above. In addition, the treatment temperature is based on the temperature used for the substrate in a temperature measuring method shown in Examples below. However, the treatment temperature may be set by the temperature in the tank thereof in a case where the treatment temperature is managed by a storage temperature or a batch treatment and the treatment temperature may be set by the temperature in a circulation channel in a case where the treatment temperature is managed by a circulatory system.

The supply rate of the treatment liquid, which is not particularly limited, is preferably in the range of 0.05 L/min to 5 L/min and more preferably in the range of 0.1 L/min to 3 L/min. It is preferable that the supply rate thereof is set to be greater than or equal to the lower limit because the in-plane uniformity of the treatment can be more excellently secured. It is preferable that the rate thereof is set to be less than or equal to the upper limit because performance stabilized at the time of performing a treatment continuously can be secured. The rotation of the semiconductor substrate also depends on the size thereof and the semiconductor substrate rotates preferably at 50 rpm to 1000 rpm from the same viewpoint described above.

In a sheet type treatment according to the preferred embodiment of the present invention, it is preferable that the semiconductor substrate is transported or rotated in a predetermined direction and a treatment liquid is brought into contact with the semiconductor substrate by spraying the treatment liquid to the space of the semiconductor substrate. The supply rate of the treatment liquid and the rotation rate of the substrate are the same as those described above.

Figure 3:
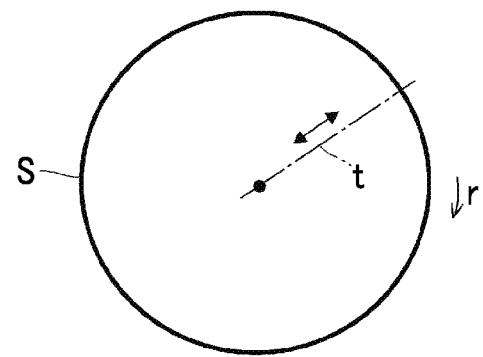
FIG. 3 is a plan view schematically illustrating a movement locus line of a nozzle with respect to a semiconductor substrate according to an embodiment of the present invention.

In the configuration of the sheet type device according to the preferred embodiment of the present invention, it is preferable that the treatment liquid is provided while the ejection opening (nozzle) is moved as illustrated in FIG. 3. Specifically, in the present embodiment, the substrate is rotated in an r direction when the treatment liquid is applied to the semiconductor substrate S. Further, the ejection opening is set to move along a movement locus line t extending to the end portion from the central portion of the semiconductor substrate. In this manner, the rotation direction of the substrate and the movement direction of the ejection opening are set to be different from each other in the present embodiment and thus both directions are set to be relatively moved. As the result, the treatment liquid can be evenly provided for the entire surface of the semiconductor substrate and the uniformity of the treatment is suitably secured.

The moving speed of the ejection opening (nozzle) is not particularly limited, but is preferably 0.1 cm/s or greater and more preferably 1 cm/s or greater. The upper limit thereof is preferably 30 cm/s or less and more preferably 15 cm/s or less. The movement locus line may be linear or curved (for example, arc-shaped). In both cases, the movement speed can be calculated from the distance of an actual locus line and the time spent for the movement thereof. The time required for treating one sheet of substrate is preferably in the range of 10 seconds to 300 seconds.

An etching rate [R1] of a layer (Ge-containing layer) containing germanium or the silicide layer thereof is not particularly limited, but it is preferable that the layer is not excessively removed due to the application of the treatment liquid. Specifically, the etching rate thereof is preferably 200 Å/min or less, more preferably 100 Å/min or less, still more preferably 50 Å/min or less, even still more preferably 20 Å/min or less, and particularly preferably 10 Å/min or less. The lower limit thereof is not particularly limited, but is practically 0.1 Å/min or greater when the measurement limit is considered.

Further, since damages of a metal electrode layer such as Al, Cu, Ti, or W and an insulating film layer such as $HfO_x$, $HfSiO_x$, $WO_x$, $AlO_x$, $SiO_x$, SiOC, SiON, TiN, or SiN can be suitably suppressed, the treatment liquid according to the preferred embodiment of the present invention is preferably used for a semiconductor substrate including these layers. Further, in the present specification, in a case where the composition of a metal compound is mentioned by the combination of the elements, this means that metal compounds with arbitrary compositions are broadly included. For example, SiOC (SiON) does not mean that the ratio of the amounts thereof is 1:1:1 but means that Si, O, and C (N) coexist. The same applies throughout the present specification and also to other metal compounds.

[Resist]

The resist to be applied to the present invention is not particularly limited, and known resist materials are used. For example, a positive type resist, a negative type resist, and a positive-negative compatible type photoresist are exemplified. Specific examples of the positive type resist include a vinyl cinnamate-based resist, a cyclization polyisobutylene-based resist, an azo-novolak resin-based resist, and a diazoketone-novolak resin-based resist. Further, specific examples of the negative type resist include an azide-cyclization polyisoprene-based resist, an azide-phenolic resin-based resist, and a chloromethyl polystyrene-based resist. Further, specific examples of the positive-negative compatible type photoresist include a poly(p-butoxycarbonyloxystyrene)-based photoresist.

In the present invention, among these, the positive type resist is preferable. Particularly, a positive type resist including at least one of a novolak resin or a polyhydroxystyrene resin is effectively stripped. In addition, since the treatment liquid of the present invention has excellent performance, the stripper is effective for stripping of a resist layer having a film thickness of 5 μm to 500 μm.

As the positive type resist including at least one of a novolak resin and a polyhydroxystyrene resin, more specifically, a positive type resist that contains a resin having a repeating unit represented by any of the following Formulae (R-1) and (R-2) is exemplified.

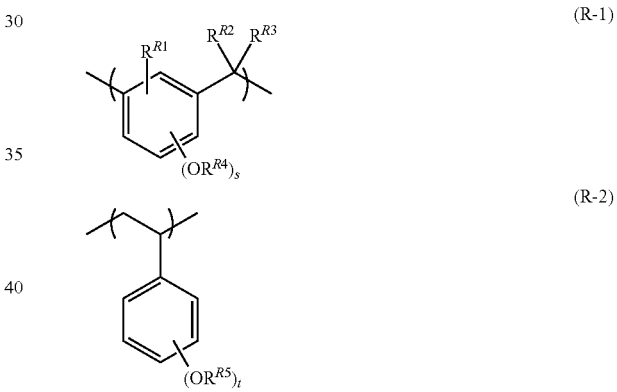

In the formulae, $R^{R1}$ to $R^{R5}$ each independently represent a hydrogen atom or an alkyl group (the number of carbon atoms is preferably in a range of 1 to 12, more preferably in a range of 1 to 6, and particularly preferably in a range of 1 to 3). s represents an integer of 1 to 3. t represents an integer of 1 to 5. The molecular weight of the resin is not particularly limited, but the weight average molecular weight thereof is typically in a range of 1000 to 1000000, preferably in a range of 2000 to 100000, and more preferably in a range of 3000 to 50000 in terms of polystyrene.

The resist may be exposed according to a usual method, but can be performed by irradiating the resist with active energy rays selected from a g-line, an h-line, an i-line, KrF excimer laser, and ArF excimer laser. It is preferable that the exposure is performed at an illuminance of 5000 W/m² to 18000 W/m².

[Manufacture of Semiconductor-substrate Product]

According to a method for manufacturing a semiconductor device according to the present invention, first, a gate insulating film formed of high-dielectric constant materials (such as $HfSiO_4$, $ZrO_2$, $ZrSiO_4$, $Al_2O_3$, $HfO_2$, and $La_2O_3$) or a gate electrode layer formed of polysilicon is formed on a substrate (for example, an ion-implanted n-type or p-type substrate) using a technique of sputtering or the like (etched-layer formation process). Next, the formed gate insulating film or gate electrode layer is coated with a resist and a predetermined pattern is formed by photolithography. After the pattern is formed, an unnecessary portion of the resist is developed and removed (resist development process), the resist pattern is used as a mask and an unmasked region is subjected to dry etching or wet etching (etching process), and then the gate insulating film or gate electrode layer is removed. Thereafter, in an ion implantation treatment (ion implantation process), ionized p-type or n-type impurity elements are implanted into the substrate so that a p-type or n-type impurity implantation region (so-called source/drain region) is formed on the substrate. Subsequently, if necessary, a treatment of stripping the resist film remaining on the substrate is performed after an ashing treatment (ashing process) is performed.

In the present embodiment, a salicide process described below may be performed. Specifically, it is preferable that the semiconductor-substrate product having a desired structure is manufactured by performing a process of obtaining a semiconductor substrate in which a layer of a substrate and a metal layer are formed on a silicon wafer, a process of annealing the semiconductor substrate, and a process of applying a treatment liquid to the semiconductor substrate to be treated. Moreover, the order of the processes is not limitatively interpreted and other processes may be further included between respective processes. The size of a wafer is not particularly limited, but a wafer whose diameter is 8 inches, 12 inches, or 14 inches is preferably used (1 inch=25.4 mm).

In the present specification, the modified resist indicates a resist in a state of being chemically or physically denatured due to the influence of ashing or etching. Typically, as described above, a resist which is modified due to the plasma etching or dry etching is exemplified. The state of modification of a resist is not particularly limited, a case where a polymer compound constituting a resist is chemically changed and a molecular state having a different structure is formed is exemplified.

In addition, the term "preparation" in the present specification means comprising a specific material through synthesis or a mixture or providing a predetermined product by purchase. Moreover, in the present specification, use of the treatment liquid so as to treat respective materials of the semiconductor substrate is referred to as "application," but the embodiment thereof is not particularly limited. For example, the application broadly includes the treatment liquid being brought into contact with the substrate. Specifically, the treatment may be performed by immersing a batch type device or performed through ejection using a sheet type device.

EXAMPLES

Hereinafter, the present invention will be specifically described with reference to Examples, but the present invention is not limited to Examples described below. Further. "%" or "part" shown as the formulation or the blending amount in Examples is on a mass basis unless otherwise noted.

Example 1 and Comparative Example 1

(Preparation of Test Substrate)
A $SiO_x$ layer was formed on a commercially available silicon substrate (diameter: 12 inches). As a resist, a KrF resist "GKRS-6953A01G" manufactured by Fujifilm Electronic Materials Co., Ltd. (containing a hydroxystyrene resin) was used and this resist was formed on the substrate by a spin coater. The thickness of the resist at this time was 10 μm. In addition, an optional photomask was used and an exposure treatment was performed. A development treatment (Table 2) was performed by applying a developer to the resist after the exposure.

Next, As+ was ion-implanted into the above-described resist film. It was confirmed that the modified resist after ion implantation was cured. At this time, the dosage was set to be greater than $1 \times 10^{14}$ $cm^{-2}$.

(Test for Applying Treatment Liquid)
The treatment was performed under the following conditions in a sheet type device (POLOS (trade name), manufactured by SPS-Europe B. V.) with respect to the blanket wafer and the substrate for a test and an evaluation test was carried out. The same applies to the stripping treatment, the rinsing treatment, and the developing treatment.
Treatment temperature: listed in the tables
Ejection amount: 1 L/min.
Wafer rotation speed: 500 rpm
Nozzle movement speed: 7 cm/s
In addition, the treatment liquid was supplied using a device of FIG. 2. The treatment liquid was used for the test within 5 minutes after being prepared.

(Method for Measuring Treatment Temperature)
A radiation thermometer IT-550F (trade name, manufactured by HORIBA, Ltd.) was fixed to a position having a height of 30 cm on a wafer in the sheet type device. The thermometer was directed to the surface of the wafer outside from the center thereof by a distance of 2 cm and the temperature was measured while circulating a liquid chemical. The temperature was continuously recorded using a computer through digital output from the radiation thermometer. Among these, a value obtained by averaging the recorded values of the temperature for 10 seconds at the time when the temperature thereof was stabilized was set as a temperature on the wafer.

(pH)
The pH was measured at room temperature (25° C.) using F-51 (trade name, manufactured by HORIBA, Ltd.).

(Etching Rate)
The etching rate (ER) of the germanium-containing layer was calculated by measuring the film thickness before or after the etching treatment using Ellipsometry (VASE Spectroscopic ellipsometer was used, J.A. Woollam, Japan). The average value of five points was adopted (measurement conditions measurement range: 1.2 eV to 2.5 eV, measuring angles: 70 degrees and 75 degrees).

(Rinsing Treatment)
The rinsing liquid of Table 1 was applied to a substrate after the stripping treatment was performed under the above-described conditions. Thereafter, the substrate was allowed to stand in air at room temperature for 24 hours. At this time, a substrate in which black spots were generated on the surface thereof was evaluated as "Bad" and a substrate in which black spots were not generated on the surface thereof was evaluated as "Good."

(Developing Treatment)
The developability was confirmed by applying the treatment liquid of Table 2 to the resist after the exposure under the above-described conditions. The results thereof were listed in Table 2. As a result, when development was carried out in an excellent manner, this was evaluated as "Good." When development was not possible, this was evaluated as "Bad."

(Stripping Treatment)

The release properties were confirmed by applying the treatment liquid of Table 3 to the resist after the plasma ashing under the above-described conditions. The results thereof were listed in Table 3. As a result, when stripping was carried out in an excellent manner, this was evaluated as "Good." When stripping residues were generated, this was evaluated as "Bad." Further, the presence or absence of residues after the treatment was confirmed by performing observation using a scanning electron microscope.

(N/Ge)

With respect to a substrate subjected to any of the above-described rinsing treatment, development treatment, or stripping treatment, the peak intensity of Ge and N elements on each substrate was detected and converted into the concentration using an X-ray photoelectron spectroscopy apparatus (PHI QUANTERA II, manufactured by ULVAC, Inc.). The values thereof were set to N/Ge in terms of the concentration. The values are listed in each table. Moreover, when the value of the N element is larger, this means that a large amount of anticorrosive is adsorbed.

(Oxidation Reduction Potential [ORP])

With respect to a substrate subjected to any of the above-described rinsing treatment, development treatment, or stripping treatment, the oxidation reduction potential (corrosion potential) on each substrate was evaluated using an electrochemical measuring apparatus (HZ-3000, manufactured by HOKUTO DENKO CORP.). The values are listed in each table.

TABLE 1

(rinsing liquid)

| | Blending | | | | Treatment | | | Test results | | Test results | |
|---|---|---|---|---|---|---|---|---|---|---|---|
| | Component 1 | | Component 2 | | PH | temperature | Treatment | Ge ER | | | ORP |
| No. | | % by mass | | % by mass | (5-16) | (° C.) | time (s) | (Å/min) | Rinsing effects | N/Ge | (mV) |
| 101 | | | Pure water | 100.0 | <u>3</u> | 25 | 60 | 48 | Good | 0.14 | −0.26 |
| 102 | | | Pure water | 100.0 | 5 | 25 | 60 | 15 | Good | 0.13 | −0.20 |
| 103 | | | Pure water | 100.0 | 14 | 25 | 60 | 110 | Good | 0.15 | −0.56 |
| 104 | | | Pure water | 100.0 | <u>≥16</u> | 25 | 60 | 295 | Good | 0.14 | −0.68 |
| 105 | Polyethyleneimine | 0.5 | Pure water | 99.5 | <u>3</u> | 25 | 60 | 46 | Good | 0.21 | −0.23 |
| 106 | Polyethyleneimine | 0.5 | Pure water | 99.5 | 5 | 25 | 60 | 3 | Good | 0.68 | −0.12 |
| 107 | Polyethyleneimine | 0.5 | Pure water | 99.5 | 6 | 25 | 60 | 4 | Good | 0.72 | −0.18 |
| 108 | Polyethyleneimine | 0.5 | Pure water | 99.5 | 7 | 25 | 60 | 6 | Good | 0.71 | −0.25 |
| 109 | Polyethyleneimine | 0.5 | Pure water | 99.5 | 8 | 25 | 60 | 9 | Good | 0.73 | −0.31 |
| 110 | Polyethyleneimine | 0.5 | Pure water | 99.5 | 9 | 25 | 60 | 12 | Good | 0.75 | −0.35 |
| 111 | Polyethyleneimine | 0.5 | Pure water | 99.5 | 10 | 25 | 60 | 15 | Good | 0.78 | −0.38 |
| 112 | Polyethyleneimine | 0.5 | Pure water | 99.5 | 11 | 25 | 60 | 18 | Good | 0.75 | −0.43 |
| 113 | Polyethyleneimine | 0.5 | Pure water | 99.5 | 12 | 25 | 60 | 20 | Good | 0.73 | −0.49 |
| 114 | Polyethyleneimine | 0.5 | Pure water | 99.5 | 13 | 25 | 60 | 22 | Good | 0.74 | −0.51 |
| 115 | Polyethyleneimine | 0.5 | Pure water | 99.5 | 14 | 25 | 60 | 25 | Good | 0.72 | −0.55 |
| 116 | Polyethyleneimine | 0.5 | Pure water | 99.5 | <u>≥16</u> | 25 | 60 | 200 | Good | 0.68 | −0.67 |
| 117 | N,N-diethylhydroxylamine | 0.5 | Pure water | 99.5 | <u>3</u> | 25 | 60 | 40 | Good | 0.13 | −0.18 |
| 118 | N,N-diethylhydroxylamine | 0.5 | Pure water | 99.5 | 5 | 25 | 60 | 8 | Good | 0.14 | 0.58 |
| 119 | N,N-diethylhydroxylamine | 0.5 | Pure water | 99.5 | 6 | 25 | 60 | 11 | Good | 0.13 | 0.50 |
| 120 | N,N-diethylhydroxylamine | 0.5 | Pure water | 99.5 | 7 | 25 | 60 | 15 | Good | 0.14 | 0.44 |
| 121 | N,N-diethylhydroxylamine | 0.5 | Pure water | 99.5 | 8 | 25 | 60 | 17 | Good | 0.14 | 0.39 |
| 122 | N,N-diethylhydroxylamine | 0.5 | Pure water | 99.5 | 9 | 25 | 60 | 21 | Good | 0.15 | 0.33 |
| 123 | N,N-diethylhydroxylamine | 0.5 | Pure water | 99.5 | 10 | 25 | 60 | 25 | Good | 0.14 | 0.31 |
| 124 | N,N-diethylhydroxylamine | 0.5 | Pure water | 99.5 | 11 | 25 | 60 | 29 | Good | 0.13 | 0.27 |
| 125 | N,N-diethylhydroxylamine | 0.5 | Pure water | 99.5 | 12 | 25 | 60 | 31 | Good | 0.14 | 0.21 |
| 126 | N,N-diethylhydroxylamine | 0.5 | Pure water | 99.5 | 13 | 25 | 60 | 36 | Good | 0.15 | 0.18 |
| 127 | N,N-diethylhydroxylamine | 0.5 | Pure water | 99.5 | 14 | 25 | 60 | 41 | Good | 0.15 | 0.18 |
| 128 | N,N-diethylhydroxylamine | 0.5 | Pure water | 99.5 | <u>≥16</u> | 25 | 60 | 254 | Good | 0.12 | −0.64 |
| 129 | polyethyleneimine<br>N,N-diethylhydroxylamine | 0.5<br>0.5 | Pure water | 99.0 | 14 | 25 | 60 | <1 | Good | 0.85 | 0.39 |

The pH values thereof were adjusted so as to be the values in the table by adding KOH or $H_2CO_3$. The range of the pH values in the embodiment of the present invention were defined to be in a range of 5 to 16.

TABLE 2

(developer)

| | Blending | | | | | | Treatment | | Clean- | Test results | | Test results | |
|---|---|---|---|---|---|---|---|---|---|---|---|---|---|
| | Component 1 | | Component 2 | | Component 4 | | tem- | Treatment | ing | | Devel- | | ORP |
| No. | | % by mass | | % by mass | | % by mass | PH | perature (° C.) | time (s) | with water | Ge ER (Å/min) | opment effects | N/Ge | (mV) |
| 201 | TMAH | | | | Pure water | 100.0 | 14 | 25 | 60 | Yes | 150 | Good | 0.16 | −0.64 |
| 202 | TMAH | 2.0 | Polyethylencimine | 0.5 | Pure water | 97.5 | 14 | 25 | 60 | Yes | 29 | Good | 0.85 | −0.58 |

TABLE 2-continued (developer)

| No. | Component 1 | % by mass | Component 2 | % by mass | Component 4 | % by mass | PH | Treatment temperature (° C.) | Treatment time (s) | Cleaning with water | Ge ER (Å/min) | Development effects | N/Ge | ORP (mV) |
|---|---|---|---|---|---|---|---|---|---|---|---|---|---|---|
| 203 | TMAH | 2.0 | Gallic acid | 0.5 | Pure water | 97.5 | 14 | 25 | 60 | Yes | 50 | Good | 0.16 | 0.08 |
| 204 | TMAH | 2.0 | N,N-diethylhydroxylamine | 0.5 | Pure water | 97.5 | 14 | 25 | 60 | Yes | 45 | Good | 0.17 | 0.16 |
| 205 | TMAH | 2.0 | Adipohydrazide | 0.5 | Pure water | 97.5 | 14 | 25 | 60 | Yes | 46 | Good | 0.15 | 0.14 |
| 206 | TMAH | 2.0 | Ascorbic acid | 0.5 | Pure water | 97.5 | 14 | 25 | 60 | Yes | 48 | Good | 0.58 | −0.61 |
| 207 | TMAH | 2.0 | Tetrabutylammonium | 0.5 | Pure water | 97.5 | 14 | 25 | 60 | Yes | 95 | Good | 0.37 | −0.62 |
| 208 | TMAH | 2.0 | Hexadecyl trimethyl ammonium | 0.5 | Pure water | 97.5 | 14 | 25 | 60 | Yes | 35 | Good | 0.73 | −0.63 |
| 209 | TMAH | 2.0 | Dodecyl pyridinium | 0.5 | Pure water | 97.5 | 14 | 25 | 60 | Yes | 40 | Good | 0.66 | −0.64 |
| 210 | TMAH | 2.0 | N-hydroxyphthalimide | 0.5 | Pure water | 97.5 | 14 | 25 | 60 | Yes | 82 | Good | 0.18 | −0.20 |
| 211 | TMAH | 2.0 | N-methylhydroxyamine | 0.5 | Pure water | 97.5 | 14 | 25 | 60 | Yes | 72 | Good | 0.17 | −0.14 |
| 212 | TMAH | 2.0 | Hydroxyurea | 0.5 | Pure water | 97.5 | 14 | 25 | 60 | Yes | 66 | Good | 0.19 | −0.09 |
| 213 | TMAH | 2.0 | Acetamide oxime | 0.5 | Pure water | 97.5 | 14 | 25 | 60 | Yes | 78 | Good | 0.16 | −0.18 |
| 214 | TMAH | 2.0 | Acetoxime | 0.5 | Pure water | 97.5 | 14 | 25 | 60 | Yes | 65 | Good | 0.17 | −0.09 |
| 215 | TMAH | 2.0 | 1,1-dimethylhydrazine | 0.5 | Pure water | 97.5 | 14 | 25 | 60 | Yes | 58 | Good | 0.17 | −0.02 |
| 216 | TMAH | 2.0 | acetohydrazide | 0.5 | Pure water | 97.5 | 14 | 25 | 60 | Yes | 62 | Good | 0.18 | −0.06 |
| 217 | TMAH | 2.0 | Semicarbazide | 0.5 | Pure water | 97.5 | 14 | 25 | 60 | Yes | 60 | Good | 0.19 | −0.04 |
| 218 | TMAH | 2.0 | Carbohydrazide | 0.5 | Pure water | 97.5 | 14 | 25 | 60 | Yes | 57 | Good | 0.16 | −0.01 |
| 219 | TMAH | 2.0 | Aminoguanidine | 0.5 | Pure water | 97.5 | 14 | 25 | 60 | Yes | 65 | Good | 0.17 | −0.09 |
| 220 | TMAH | 2.0 | Methyl carbazic acid | 0.5 | Pure water | 97.5 | 14 | 25 | 60 | Yes | 55 | Good | 0.18 | 0.01 |
| 221 | TMAH | 2.0 | Catechol | 0.5 | Pure water | 97.5 | 14 | 25 | 60 | Yes | 53 | Good | 0.16 | 0.04 |
| 222 | TMAH | 2.0 | Pyrogallol | 0.5 | Pure water | 97.5 | 14 | 25 | 60 | Yes | 52 | Good | 0.16 | 0.05 |
| 223 | TMAH | 2.0 | 3,4-dihydroxybenzoic acid | 0.5 | Pure water | 97.5 | 14 | 25 | 60 | Yes | 53 | Good | 0.16 | 0.04 |
| 224 | TMAH | 2.0 | Methyl gallate | 0.5 | Pure water | 97.5 | 14 | 25 | 60 | Yes | 59 | Good | 0.17 | −0.03 |
| 225 | TMAH | 2.0 | Phloroglucin dihydrate | 0.5 | Pure water | 97.5 | 14 | 25 | 60 | Yes | 65 | Good | 0.18 | −0.09 |
| 226 | TMAH | 2.0 | Resorcinol | 0.5 | Pure water | 97.5 | 14 | 25 | 60 | Yes | 53 | Good | 0.17 | 0.04 |
| 227 | TMAH | 2.0 | 6-O-palmitoyl-L-ascorbic acid | 0.5 | Pure water | 97.5 | 14 | 25 | 60 | Yes | 50 | Good | 0.18 | 0.08 |
| 228 | TMAH | 2.0 | Oxalic acid | 0.5 | Pure water | 97.5 | 14 | 25 | 60 | Yes | 58 | Good | 0.16 | −0.02 |
| 229 | TMAH | 2.0 | Polyvinylamine | 0.5 | Pure water | 97.5 | 14 | 25 | 60 | Yes | 35 | Good | 0.73 | −0.62 |
| 230 | TMAH | 2.0 | polyallylamine | 0.5 | Pure water | 97.5 | 14 | 25 | 60 | Yes | 35 | Good | 0.73 | −0.61 |
| 231 | TMAH | 2.0 | Polyhexadimethrine | 0.5 | Pure water | 97.5 | 14 | 25 | 60 | Yes | 32 | Good | 0.78 | −0.61 |
| 232 | TMAH | 2.0 | polydimethyl diallyl ammonium (salt) | 0.5 | Pure water | 97.5 | 14 | 25 | 60 | Yes | 28 | Good | 0.87 | −0.63 |
| 233 | TMAH | 2.0 | poly(4-vinylpyridine) | 0.5 | Pure water | 97.5 | 14 | 25 | 60 | Yes | 41 | Good | 0.65 | −0.62 |
| 234 | TMAH | 2.0 | polyornithine | 0.5 | Pare water | 97.5 | 14 | 25 | 60 | Yes | 46 | Good | 0.59 | −0.61 |
| 235 | TMAH | 2.0 | Polylysine | 0.5 | Pure water | 97.5 | 14 | 25 | 60 | Yes | 48 | Good | 0.58 | −0.63 |
| 236 | TMAH | 2.0 | polyarginine | 0.5 | Pure water | 97.5 | 14 | 25 | 60 | Yes | 45 | Good | 0.60 | −0.64 |
| 237 | TMAH | 2.0 | Polyhistidine | 0.5 | Pure water | 97.5 | 14 | 25 | 60 | Yes | 35 | Good | 0.73 | −0.62 |
| 238 | TMAH | 2.0 | Polyvinyl imidazole | 0.5 | Pure water | 97.5 | 14 | 25 | 60 | Yes | 38 | Good | 0.69 | −0.61 |
| 239 | TMAH | 2.0 | Polydiallylamine | 0.5 | Pure water | 97.5 | 14 | 25 | 60 | Yes | 41 | Good | 0.65 | −0.63 |
| 240 | TMAH | 2.0 | Polymethyl diallylamine | 0.5 | Pure water | 97.5 | 14 | 25 | 60 | Yes | 39 | Good | 0.67 | −0.62 |
| 241 | TMAH | 2.0 | Tetraethylenepentamine | 0.5 | Pure water | 97.5 | 14 | 25 | 60 | Yes | 49 | Good | 0.57 | −0.63 |
| 242 | TMAH | 2.0 | Pentaethylenehexamine | 0.5 | Pure water | 97.5 | 14 | 25 | 60 | Yes | 51 | Good | 0.55 | −0.62 |
| 243 | TMAH | 2.0 | N,N-diethylhydroxylamine polyethyleneimine | 0.5 0.5 | Pure water | 97.0 | 14 | 25 | 60 | Yes | <1 | Good | 1.13 | 0.29 |

The pH values thereof were adjusted so as to be the values in the table by adding KOH or $H_2CO_3$. The range of the pH values in the embodiment of the present invention were defined to be in a range of 5 to 16.

TABLE 3

(stripper)

| No. | Component 1 | % by mass | Component 2 | % by mass | Component 3 | % by mass | PH | Treatment temperature (° C.) | Treatment time (s) | Cleaning with water | Ge ER (Å/min) | Stripping effects | N/Ge | ORP (mV) |
|---|---|---|---|---|---|---|---|---|---|---|---|---|---|---|
| 301 | DMSO | 50.0 | 2-aminoethanol | 50.0 | | | 14 | 60 | 60 | Yes | 30 | Good | 0.30 | −0.59 |
| 302 | $H_2SO_4$ | 75.0 | $H_2O_2$ | 25.0 | | | <1 | 60 | 60 | Yes | >3000 | Good | 0.25 | −1.23 |
| 303 | DMSO | 50.0 | 2-aminoethanol | 49.5 | Polyethyleneimine | 0.5 | 14 | 60 | 60 | Yes | <1 | Good | 1.44 | −0.52 |
| 304 | DMSO | 50.0 | 2-aminoethanol | 49.5 | Polyallylamine | 0.5 | 14 | 60 | 60 | Yes | 2 | Good | 1.35 | −0.53 |
| 305 | DMSO | 50.0 | 2-aminoethanol | 49.5 | Gallic acid | 0.5 | 14 | 60 | 60 | Yes | 8 | Good | 0.35 | −0.09 |
| 306 | DMSO | 50.0 | 2-aminoethanol | 49.5 | N,N-diethylhydroxylamine | 0.5 | 14 | 60 | 60 | Yes | <1 | Good | 0.32 | 0.02 |
| 307 | DMSO | 50.0 | 2-aminoethanol | 49.5 | Glyoxylic acid | 0.5 | 14 | 60 | 60 | Yes | <1 | Good | 0.33 | 0.00 |

TABLE 3-continued (stripper)

| | Blending | | | | | | Treatment temperature (° C.) | Treatment time (s) | Cleaning with water | Test results | | Test results | |
|---|---|---|---|---|---|---|---|---|---|---|---|---|---|
| | Component 1 | | Component 2 | | Component 3 | | | | | | Stripping effects | | ORP |
| No. | | % by mass | | % by mass | | % by mass | PH | | | | Ge ER (Å/min) | N/Ge | (mV) |
| 308 | DMSO | 50.0 | 2-aminoethanol | 49.5 | Adipohydrazide | 0.5 | 14 | 60 | 60 | Yes | 5 | Good | 0.31 | −0.03 |
| 309 | DMSO | 50.0 | 2-aminoethanol | 49.5 | Ascorbic acid | 0.5 | 14 | 60 | 60 | Yes | 7 | Good | 0.35 | −0.05 |
| 310 | DMSO | 50.0 | 2-(2-aminoethoxy)ethanol | 49.5 | Polyethyleneimine | 0.5 | 14 | 60 | 60 | Yes | <1 | Good | 1.41 | −0.51 |
| 311 | DMSO | 50.0 | Diethanolamine | 49.5 | Polyethyleneimine | 0.5 | 14 | 60 | 60 | Yes | <1 | Good | 1.39 | −0.53 |
| 312 | Ethylene carbonate | 50.0 | 2-aminoethanol | 49.5 | Polyethyleneimine | 0.5 | 14 | 60 | 60 | Yes | <1 | Good | 1.35 | −0.55 |
| 313 | Propylene carbonate | 50.0 | 2-aminoethanol | 49.5 | Polyethyleneimine | 0.5 | 14 | 60 | 60 | Yes | <1 | Good | 1.32 | −0.54 |
| 314 | Sulfolane | 50.0 | 2-aminoethanol | 49.5 | Polyethyleneimine | 0.5 | 14 | 60 | 60 | Yes | <1 | Good | 1.25 | −0.58 |

The pH values thereof were adjusted so as to be the values in the table by adding KOH or $H_2CO_3$. The range of the pH values in the embodiment of the present invention were defined to be in a range of 5 to 16.

TABLE 4

(stripper)

| No. | Component 1 | % by mass | Component 2 | % by mass | Component 3 | % by mass | Component 4 | % by mass | pH | Treatment temperature (°C.) | Treatment time (s) | Cleaning with water | Test results Ge ER (Å/min) | Test results Stripping effects | N/Ge | ORP (mV) |
|---|---|---|---|---|---|---|---|---|---|---|---|---|---|---|---|---|
| 401 | Benzyl alcohol | 50.0 | 2-aminoethanol | 20.0 | Polyethyleneimine | 0.5 | Pure water | 29.5 | 14 | 60 | 60 | Yes | 3 | Good | 1.50 | −0.48 |
| 402 | Benzyl alcohol | 50.0 | 2-aminoethanol | 20.0 | Polyethyleneimine | 1.5 | Pure water | 28.5 | 14 | 60 | 60 | Yes | 2 | Good | 1.56 | −0.46 |
| 403 | Benzyl alcohol | 50.0 | 2-aminoethanol | 20.0 | Polyethyleneimine | 3.0 | Pure water | 27.0 | 14 | 60 | 60 | Yes | <1 | Good | 1.65 | −0.41 |
| 404 | Benzyl alcohol | 50.0 | 2-aminoethanol | 20.0 | Polyethyleneimine | 5.0 | Pure water | 25.0 | 14 | 60 | 60 | Yes | <1 | Good | 1.68 | −0.38 |
| 405 | Benzyl alcohol | 50.0 | 2-aminoethanol | 20.0 | Polyethyleneimine | 10.0 | Pure water | 20.0 | 14 | 60 | 60 | Yes | <1 | Good | 1.71 | −0.35 |
| 406 | Benzyl alcohol | 50.0 | 2-(2-aminoethoxy)ethanol | 20.0 | Polyethyleneimine | 1.5 | Pure water | 28.5 | 14 | 60 | 60 | Yes | <1 | Good | 1.48 | −0.50 |
| 407 | Benzyl alcohol | 50.0 | Diethanolamine | 20.0 | Polyethyleneimine | 1.5 | Pure water | 28.5 | 14 | 60 | 60 | Yes | <1 | Good | 1.49 | −0.51 |
| 408 | Benzyl alcohol | 50.0 | 2-aminoethanol | 20.0 | Gallic acid | 0.5 | Pure water | 29.5 | 14 | 60 | 60 | Yes | 7 | Good | 0.35 | −0.05 |
| 409 | Benzyl alcohol | 50.0 | 2-aminoethanol | 20.0 | N,N-diethylhydroxylamine | 0.5 | Pure water | 29.5 | 14 | 60 | 60 | Yes | 8 | Good | 0.40 | 0.10 |
| 410 | Benzyl alcohol | 50.0 | 2-aminoethanol | 20.0 | N,N-diethylhydroxylamine | 1.5 | Pure water | 28.5 | 14 | 60 | 60 | Yes | 5 | Good | 0.41 | 0.12 |
| 411 | Benzyl alcohol | 50.0 | 2-aminoethanol | 20.0 | N,N-diethylhydroxylamine | 3.0 | Pure water | 27.0 | 14 | 60 | 60 | Yes | 3 | Good | 0.41 | 0.15 |
| 412 | Benzyl alcohol | 50.0 | 2-aminoethanol | 20.0 | N,N-diethylhydroxylamine | 10.0 | Pure water | 20.0 | 14 | 60 | 60 | Yes | <1 | Good | 0.42 | 0.20 |
| 413 | Benzyl alcohol | 50.0 | 2-aminoethanol | 20.0 | Adipohydrazide | 0.5 | Pure water | 29.5 | 14 | 60 | 60 | Yes | 6 | Good | 0.40 | −0.03 |
| 414 | Benzyl alcohol | 50.0 | 2-aminoethanol | 20.0 | Ascorbic acid | 0.5 | Pure water | 29.5 | 14 | 60 | 60 | Yes | 10 | Good | 0.33 | −0.12 |
| 415 | Benzyl alcohol | 50.0 | 2-aminoethanol | 20.0 | Tetrabutylammonium | 0.5 | Pure water | 29.5 | 14 | 60 | 60 | Yes | 13 | Good | 0.85 | −0.18 |
| 416 | Benzyl alcohol | 50.0 | 2-aminoethanol | 20.0 | Hexadecyltrimethyl ammonium | 0.5 | Pure water | 29.5 | 14 | 60 | 60 | Yes | 3 | Good | 1.05 | −0.05 |
| 417 | Benzyl alcohol | 50.0 | 2-aminoethanol | 20.0 | Dodecyl pyridinium | 0.5 | Pure water | 29.5 | 14 | 60 | 60 | Yes | 4 | Good | 0.92 | −0.09 |
| 418 | Benzyl alcohol | 50.0 | 2-aminoethanol | 20.0 | N-hydroxyphthalimide | 0.5 | Pure water | 29.5 | 14 | 60 | 60 | Yes | 8 | Good | 0.32 | −0.11 |
| 419 | Benzyl alcohol | 50.0 | 2-aminoethanol | 20.0 | N-methylhydroxylamine | 0.5 | Pure water | 29.5 | 14 | 60 | 60 | Yes | 7 | Good | 0.31 | −0.10 |
| 420 | Benzyl alcohol | 50.0 | 2-aminoethanol | 20.0 | Hydroxyurea | 0.5 | Pure water | 29.5 | 14 | 60 | 60 | Yes | 6 | Good | 0.35 | −0.10 |
| 421 | Benzyl alcohol | 50.0 | 2-aminoethanol | 20.0 | Acetoamide oxime | 0.5 | Pure water | 29.5 | 14 | 60 | 60 | Yes | 10 | Good | 0.32 | −0.14 |

TABLE 4-continued (stripper)

| No. | Component 1 | % by mass | Component 2 | % by mass | Component 3 | % by mass | Component 4 | % by mass | PH | Treatment temperature (° C.) | Treatment time (s) | Cleaning with water | Test results Ge ER (Å/min) | Test results Stripping effects | Test results N/Ge | Test results ORP (mV) |
|---|---|---|---|---|---|---|---|---|---|---|---|---|---|---|---|---|
| 422 | Benzyl alcohol | 50.0 | 2-aminoethanol | 20.0 | Acetoxime | 0.5 | Pure water | 29.5 | 14 | 60 | 60 | Yes | 12 | Good | 0.30 | −0.20 |
| 423 | Benzyl alcohol | 50.0 | 2-aminoethanol | 20.0 | 1,1-dimethylhydrazine | 0.5 | Pure water | 29.5 | 14 | 60 | 60 | Yes | 9 | Good | 0.32 | −0.18 |
| 424 | Benzyl alcohol | 50.0 | 2-aminoethanol | 20.0 | Acetohydrazide | 0.5 | Pure water | 29.5 | 14 | 60 | 60 | Yes | 10 | Good | 0.32 | −0.13 |
| 425 | Benzyl alcohol | 50.0 | 2-aminoethanol | 20.0 | Semicarbazide | 0.5 | Pure water | 29.5 | 14 | 60 | 60 | Yes | 12 | Good | 0.30 | −0.18 |
| 426 | Benzyl alcohol | 50.0 | 2-aminoethanol | 20.0 | Carbohydrazide | 0.5 | Pure water | 29.5 | 14 | 60 | 60 | Yes | 9 | Good | 0.33 | −0.15 |
| 427 | Benzyl alcohol | 50.0 | 2-aminoethanol | 20.0 | Aminoguanidine | 0.5 | Pure water | 29.5 | 14 | 60 | 60 | Yes | 7 | Good | 0.34 | −0.12 |
| 428 | Benzyl alcohol | 50.0 | 2-aminoethanol | 20.0 | Methyl carbazic acid | 0.5 | Pure water | 29.5 | 14 | 60 | 60 | Yes | 6 | Good | 0.36 | −0.10 |
| 429 | Benzyl alcohol | 50.0 | 2-aminoethanol | 20.0 | Catechol | 0.5 | Pure water | 29.5 | 14 | 60 | 60 | Yes | 8 | Good | 0.31 | −0.16 |
| 430 | Benzyl alcohol | 50.0 | 2-aminoethanol | 20.0 | Pyrogallol | 0.5 | Pure water | 29.5 | 14 | 60 | 60 | Yes | 6 | Good | 0.35 | −0.09 |
| 431 | Benzyl alcohol | 50.0 | 2-aminoethanol | 20.0 | 3,4-dihydroxybenzoic acid | 0.5 | Pure water | 29.5 | 14 | 60 | 60 | Yes | 5 | Good | 0.38 | −0.05 |
| 432 | Benzyl alcohol | 50.0 | 2-aminoethanol | 20.0 | Methyl gallate | 0.5 | Pure water | 29.5 | 14 | 60 | 60 | Yes | 6 | Good | 0.37 | −0.11 |
| 433 | Benzyl alcohol | 50.0 | 2-aminoethanol | 20.0 | Phloroglucin dihydrate | 0.5 | Pure water | 29.5 | 14 | 60 | 60 | Yes | 8 | Good | 0.32 | −0.14 |
| 434 | Benzyl alcohol | 50.0 | 2-aminoethanol | 20.0 | Resorcinol | 0.5 | Pure water | 29.5 | 14 | 60 | 60 | Yes | 6 | Good | 0.34 | −0.13 |
| 435 | Benzyl alcohol | 50.0 | 2-aminoethanol | 20.0 | 6-O-palmitoyl-L-ascorbic acid | 0.5 | Pure water | 29.5 | 14 | 60 | 60 | Yes | 6 | Good | 0.35 | −0.12 |
| 436 | Benzyl alcohol | 50.0 | 2-aminoethanol | 20.0 | Oxalic acid | 0.5 | Pure water | 29.5 | 14 | 60 | 60 | Yes | 10 | Good | 0.31 | −0.19 |
| 437 | Benzyl alcohol | 50.0 | 2-aminoethanol | 20.0 | Polyvinylamine | 0.5 | Pure water | 29.5 | 14 | 60 | 60 | Yes | 3 | Good | 1.35 | −0.48 |
| 438 | Benzyl alcohol | 50.0 | 2-aminoethanol | 20.0 | polyallylamine | 0.5 | Pure water | 29.5 | 14 | 60 | 60 | Yes | 4 | Good | 1.26 | −0.49 |
| 439 | Benzyl alcohol | 50.0 | 2-aminoethanol | 20.0 | Polyhexadimethrine | 0.5 | Pure water | 29.5 | 14 | 60 | 60 | Yes | 3 | Good | 1.38 | −0.48 |
| 440 | Benzyl alcohol | 50.0 | 2-aminoethanol | 20.0 | polydimethyl diallyl ammonium (salt) | 0.5 | Pure water | 29.5 | 14 | 60 | 60 | Yes | 3 | Good | 1.39 | −0.49 |
| 441 | Benzyl alcohol | 50.0 | 2-aminoethanol | 20.0 | poly(4-vinylpyridine) | 0.5 | Pure water | 29.5 | 14 | 60 | 60 | Yes | 5 | Good | 1.22 | −0.50 |
| 442 | Benzyl alcohol | 50.0 | 2-aminoethanol | 20.0 | polyornithine | 0.5 | Pure water | 29.5 | 14 | 60 | 60 | Yes | 6 | Good | 1.15 | −0.50 |
| 443 | Benzyl alcohol | 50.0 | 2-aminoethanol | 20.0 | Polylysine | 0.5 | Pure water | 29.5 | 14 | 60 | 60 | Yes | 4 | Good | 1.34 | −0.49 |

TABLE 4-continued (stripper)

| No. | Component 1 | % by mass | Component 2 | % by mass | Component 3 | % by mass | Component 4 | % by mass | PH | Treatment temperature (° C.) | Treatment time (s) | Cleaning with water | Ge ER (Å/min) | Stripping effects | N/Ge | ORP (mV) |
|---|---|---|---|---|---|---|---|---|---|---|---|---|---|---|---|---|
| 444 | Benzyl alcohol | 50.0 | 2-aminoethanol | 20.0 | polyarginine | 0.5 | Pure water | 29.5 | 14 | 60 | 60 | Yes | 7 | Good | 1.08 | −0.49 |
| 445 | Benzyl alcohol | 50.0 | 2-aminoethanol | 20.0 | Polyhistidine | 0.5 | Pure water | 29.5 | 14 | 60 | 60 | Yes | 5 | Good | 1.20 | −0.48 |
| 446 | Benzyl alcohol | 50.0 | 2-aminoethanol | 20.0 | Polyvinyl imidazole | 0.5 | Pure water | 29.5 | 14 | 60 | 60 | Yes | 6 | Good | 1.18 | −0.50 |
| 447 | Benzyl alcohol | 50.0 | 2-aminoethanol | 20.0 | Polydiallylamine | 0.5 | Pure water | 29.5 | 14 | 60 | 60 | Yes | 5 | Good | 1.26 | −0.48 |
| 448 | Benzyl alcohol | 50.0 | 2-aminoethanol | 20.0 | Polymethyl diallylamine | 0.5 | Pure water | 29.5 | 14 | 60 | 60 | Yes | 4 | Good | 1.33 | −0.46 |
| 449 | Benzyl alcohol | 50.0 | 2-aminoethanol | 20.0 | Tetraethylenepentamine | 0.5 | Pure water | 29.5 | 14 | 60 | 60 | Yes | 11 | Good | 0.96 | −0.52 |
| 450 | Benzyl alcohol | 50.0 | 2-aminoethanol | 20.0 | Pentaethylenehexamine | 0.5 | Pure water | 29.5 | 14 | 60 | 60 | Yes | 12 | Good | 0.88 | −0.52 |
| 451 | Benzyl alcohol | 50.0 | 2-aminoethanol | 20.0 | Polyethyleneimine N,N-diethylhydroxylamine | 0.5 0.5 | Pure water | 29.0 | 14 | 60 | 60 | Yes | <1 | Good | 1.68 | 0.23 |
| 452 | 2-methyl-2,4-pentanediol | 50.0 | 2-aminoethanol | 20.0 | Polyethyleneimine | 1.5 | Pure water | 28.5 | 14 | 60 | 60 | Yes | <1 | Good | 1.45 | −0.46 |
| 453 | 2-phenylethanol | 50.0 | 2-aminoethanol | 20.0 | Polyethyleneimine | 1.5 | Pure water | 28.5 | 14 | 60 | 60 | Yes | <1 | Good | 1.43 | −0.45 |
| 454 | 2-phenoxyethanol | 50.0 | 2-aminoethanol | 20.0 | Polyethyleneimine | 1.5 | Pure water | 28.5 | 14 | 60 | 60 | Yes | <1 | Good | 1.41 | −0.48 |
| 455 | 3-methoxy-3-methyl-1-butanol | 50.0 | 2-aminoethanol | 20.0 | Polyethyleneimine | 1.5 | Pure water | 28.5 | 14 | 60 | 60 | Yes | <1 | Good | 1.45 | −0.49 |
| 456 | 2-ethylhexanol | 50.0 | 2-aminoethanol | 20.0 | Polyethyleneimine | 1.5 | Pure water | 28.5 | 14 | 60 | 60 | Yes | <1 | Good | 1.48 | −0.48 |
| 457 | Cyclohexanol | 50.0 | 2-aminoethanol | 20.0 | Polyethyleneimine | 1.5 | Pure water | 28.5 | 14 | 60 | 60 | Yes | <1 | Good | 1.42 | −0.47 |
| 458 | Ethylene glycol | 50.0 | 2-aminoethanol | 20.0 | Polyethyleneimine | 1.5 | Pure water | 28.5 | 14 | 60 | 60 | Yes | <1 | Good | 1.43 | −0.47 |
| 459 | Propylene glycol | 50.0 | 2-aminoethanol | 20.0 | Polyethyleneimine | 1.5 | Pure water | 28.5 | 14 | 60 | 60 | Yes | <1 | Good | 1.45 | −0.48 |

The pH values thereof were adjusted so as to be the values in the table by adding KOH or $H_2CO_3$. The range of the pH values in the embodiment of the present invention were defined to be in a range of 5 to 16.

<Annotation of Tables>

Among anticorrosive components, an anticorrosive component corresponding to a polymer having a weight average molecular weight of 2000 was used.

TMAH: tetramethyl ammonium hydroxide
DMSO: dimethyl sulfoxide
1 Å=0.1 nm

The "cleaning with water" means that cleaning was performed using secondary pure water for 10 seconds.

From the results described above, according to the treatment liquid of the present invention, an organic material on the semiconductor substrate which has a layer containing germanium can be desirably treated. Specifically, it was understood that the treatment liquid of the present invention is suitable for any of the rinsing treatment, the developing treatment, or the stripping treatment of the semiconductor substrate and exhibits excellent performance.

The present invention has been described with reference to the embodiments, but the detailed description of the invention is not intended to limit the invention unless otherwise noted and the present invention should be broadly interpreted without departing from the spirit and the scope described in the aspects of the invention.

The present application claims priority based on JP 2013-238344 filed in Japan on Nov. 18, 2013 and the contents of which are incorporated herein by reference.

EXPLANATION OF REFERENCES

1: silicon substrate
2, 3: well
21: source base portion
22: source silicide portion
23: drain base portion
24: drain silicide portion
4: gate insulating film
5: gate electrode
6: interlayer insulator
7: resist layer
71: modified-resist layer
72: unmodified-resist layer
73: plasma-modified resist layer
74: plasma-unmodified resist layer
11: treatment container (treatment tank)
12: rotary table
13: ejection opening
A: introduction port
S: substrate

What is claimed is:

1. A semiconductor substrate treatment liquid which removes an organic material on the top of a semiconductor substrate from the semiconductor substrate having a Ge-containing layer that includes germanium (Ge) or cleans the surface thereof, the treatment liquid comprising:
a liquid chemical component which adjusts the pH of the treatment liquid to be in a range of 5 to 16, and
an anticorrosive component which is used to prevent corrosion of the Ge-containing layer,
wherein the anticorrosive component is at least one selected from a compound represented by any of the following Formulae (4), (5), (10), and (11) and a compound having a repeating unit represented by any of the following Formulae (8) and (9),

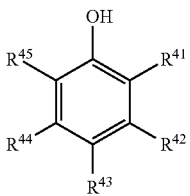

(4)

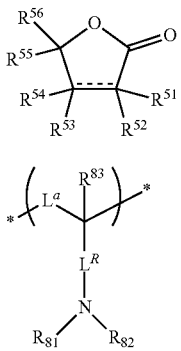

(5)

(8)

(9)

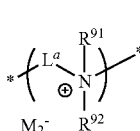

(10)

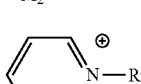

(11)

wherein, in Formulae (4), (5), (8), (9), (10), and (11), $R^{41}$ to $R^{45}$, $R^{51}$ to $R^{56}$, $R^{81}$ to $R^{83}$, $R^{91}$, $R^{92}$, $R^{A1}$, $R^{B1}$, and $R^{B2}$ each independently represent a group including a hydrogen atom, a carbon atom, an oxygen atom, a sulfur atom, or a nitrogen atom, $L^a$ represents a linking group, $M_2^{31}$, and $M_3^-$ represent a counter anion, the broken line in Formula (5) represents any of a single bond and a double bond, and in the case where the broken line represents a double bond, $R^{52}$ and $R^{54}$ are not present, and $L^R$ represents a single bond or a linking group.

2. The treatment liquid according to claim 1, wherein the concentration of the anticorrosive component is in a range of 0.01% by mass to 20% by mass.

3. The treatment liquid according to claim 1, wherein,
in Formula (4), $R^{41}$ to $R^{45}$ each independently represent a hydrogen atom, a hydroxy group, a carboxyl group, an alkyl group having 1 to 12 carbon atoms, an alkenyl group having 2 to 12 carbon atoms, or an aryl group having 6 to 14 carbon atoms;
in Formula (5), $R^{51}$ to $R^{56}$ each independently represent a hydrogen atom, a hydroxy group, a carboxyl group, an alkyl group having 1 to 12 carbon atoms, an alkenyl group having 2 to 12 carbon atoms, or an aryl group having 6 to 14 carbon atoms;
in Formula (8), $R^{81}$ and $R^{82}$ represent a hydrogen atom, an alkyl group having 1 to 12 carbon atoms, an alkenyl group having 2 to 12 carbon atoms, or an aryl group having 6 to 14 carbon atoms, $L^R$ represents a single bond, an alkylene group having 1 to 12 carbon atoms, an alkenylene group having 2 to 12 carbon atoms, an arylene group having 6 to 14 carbon atoms, or an aralkylene group having 7 to 15 carbon atoms, and $R^{83}$ represents a hydrogen atom or a methyl group;

in Formula (9), $R^{91}$ and $R^{92}$ represents a hydrogen atom, an alkyl group having 1 to 12 carbon atoms, an alkenyl group having 2 to 12 carbon atoms, or an aryl group having 6 to 14 carbon atoms, and $L^a$ represents a methylene group;

in Formula (10), $R^{41}$ represents an alkyl group having 1 to 24 carbon atoms, an alkenyl group having 2 to 24 carbon atoms, or an aryl group having 6 to 14 carbon atoms; and in Formula (11), $R^{B1}$ and $R^{B2}$ each independently represent an alkyl group having 1 to 12 carbon atoms, an alkenyl group having 2 to 12 carbon atoms, an aryl group having 6 to 14 carbon atoms, or an amino group.

4. The treatment liquid according to claim 1,
wherein the compound selected from a compound represented by Formula (10) and the compound having a repeating unit represented by any of Formulae (8) and (9) is used as an inhibitor type anticorrosive component, and the compound represented by any of Formulae (4), (5) and (11) is used as a reducing agent type anticorrosive component.

5. The treatment liquid according to claim 1 which is a rinsing liquid used to clean the semiconductor substrate.

6. The treatment liquid according to claim 1 which is a developer used to develop a resist on the semiconductor substrate.

7. The treatment liquid according to claim 1,
wherein the organic material includes a modified-resist component, and
the treatment liquid is a stripper which strips the organic material.

8. The treatment liquid according to claim 1,
wherein the liquid chemical component is water when the treatment liquid is used as a rinsing liquid, is an alkali compound when the treatment liquid is used as a developer, and is an alcohol compound, an aprotic solvent, an organic amine compound, or a combination of these when the treatment liquid is used as a stripper.

9. The treatment liquid according to claim 8, wherein a CLogP value of the alcohol compound is 0 or greater.

10. A semiconductor substrate treatment liquid which removes an organic material on the top of a semiconductor substrate from the semiconductor substrate having a Ge-containing layer that includes germanium (Ge) or cleans the surface thereof, the treatment liquid comprising:
a liquid chemical component, and
an anticorrosive component which is used to prevent corrosion of the Ge-containing layer,
wherein the anticorrosive component is at least one selected from a compound represented by any of the following Formulae (4), (5), (10), and (11) and a compound having a repeating unit represented by any of the following Formulae (8) and (9),

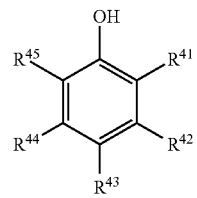  (4)

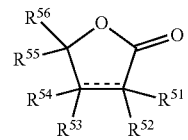  (5)

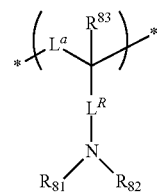  (8)

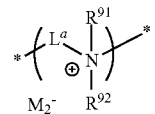  (9)

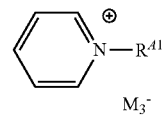  (10)

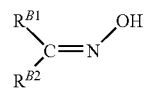  (11)

wherein, in Formulae (4), (5), (8), (9), (10), and (11), $R^{41}$ to $R^{45}$, $R^{51}$ to $R^{56}$, $R^{81}$ to $R^{83}$, $R^{91}$, $R^{92}$, $R^{A1}$, $R^{B1}$ and $R^{B2}$ each independently represent a group including a hydrogen atom, a carbon atom, an oxygen atom, a sulfur atom, or a nitrogen atom, $L^a$ represents a linking group, $M_2^-$, and $M_3^-$ represent a counter anion, the broken line in Formula (5) represents any of a single bond and a double bond, and in the case where the broken line represents a double bond, $R^{52}$ and $R^{54}$ are not present, and $L^R$ represents a single bond or a linking group.

11. The treatment liquid according to claim 10,
wherein the liquid chemical component is water when the treatment liquid is used as a rinsing liquid, is an alkali compound when the treatment liquid is used as a developer, and is an alcohol compound, an aprotic solvent, an organic amine compound, or a combination of these when the treatment liquid is used as a stripper.

12. A method for treating a semiconductor substrate comprising:
removing an organic material on the top of a semiconductor substrate from the semiconductor substrate having a Ge-containing layer that includes germanium (Ge) or cleaning the surface thereof by applying thereto a treatment liquid,
wherein the treatment liquid includes a liquid chemical component which adjusts the pH of the treatment liquid to be in a range of 5 to 16, and an anticorrosive component which is used to prevent corrosion of the Ge-containing layer.

13. The treatment method according to claim 12, wherein the anticorrosive component is at least one selected from a compound represented by any of the following Formulae (1) to (6), (10), and (11) and a compound having a repeating unit represented by any of the following Formulae (7) to (9),

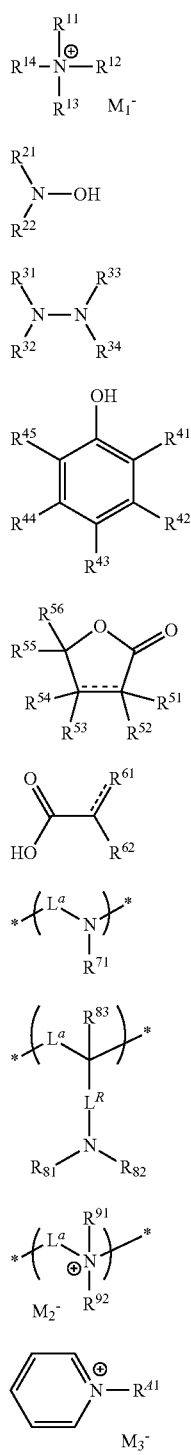

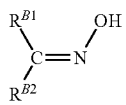

(11)

$R^{11}$ to $R^{14}$, $R^{21}$, $R^{22}$, $R^{31}$ to $R^{34}$, $R^{41}$ to $R^{45}$, $R^{51}$ to $R^{56}$, $R^{61}$, $R^{62}$, $R^{71}$, $R^{81}$ to $R^{83}$, $R^{91}$, $R^{92}$, $R^{A1}$, $R^{B1}$, and $R^{B2}$ each independently represent a group including a hydrogen atom, a carbon atom, an oxygen atom, a sulfur atom, or a nitrogen atom, $L^a$ represents a linking group, $M_1^-$, $M_2^-$, and $M_3^-$ represent a counter anion, the broken line in Formula (5) represents any of a single bond and a double bond, and in the case where the broken line represents a double bond, $R^{52}$ and $R^{54}$ are not present, the broken line in Formula (6) means that $R^{61}$ represents an oxygen atom or a sulfur atom so that the oxygen atom or the sulfur atom may constitute a carbonyl group (C=O) or a thiocarbonyl group (C=S) together with a carbon atom to which the oxygen atom or the sulfur atom is bonded, and $L^R$ represents a single bond or a linking group.

14. The treatment method according to claim 12, wherein the liquid chemical component is water when the treatment liquid is used as a rinsing liquid, is an alkali component when the treatment liquid is used as a developer, and is an alcohol compound, an aprotic solvent, an organic amine compound, or a combination of these when the treatment liquid is used as a stripper.

15. A method of manufacturing a semiconductor-substrate product comprising:
treating a semiconductor substrate according to the treatment method according to claim 12 to obtain a semiconductor-substrate product.

16. An anticorrosive of a Ge-containing layer which includes germanium (Ge) applied to a semiconductor substrate, consisting of: a compound represented by any of the following Formulae (4), (5), (10), and (11), and a compound having a repeating unit represented by any of the following Formulae (8) and (9),

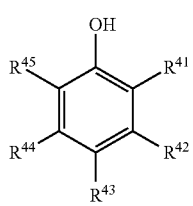

(4)

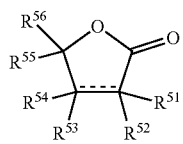

(5)

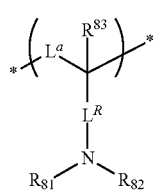

(8)

-continued

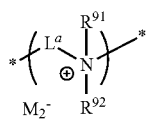
(9)

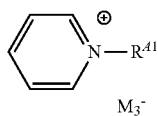
(10)

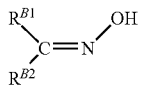
(11)

wherein, in Formulae (4), (5), (8) and (9), (10) and (11), $R^{41}$ to $R^{45}$, $R^{51}$ to $R^{56}$, $R^{81}$ to $R^{83}$, $R^{91}$, $R^{92}$, $R^{A1}$, $R^{B1}$, and $R^{B2}$ each independently represent a group including a hydrogen atom, a carbon atom, an oxygen atom, a sulfur atom, or a nitrogen atom, $L^a$ represents a linking group, $M_2^-$, and $M_3^-$ represent a counter anion, the broken line in Formula (5) represents any of a single bond and a double bond, and in the case where the broken line represents a double bond, $R^{52}$ and $R^{54}$ are not present, and $L^R$ represents a single bond or a linking group.

17. A semiconductor substrate treatment liquid which removes an organic material on the top of a semiconductor substrate from the semiconductor substrate having a Ge-containing layer that includes germanium (Ge) or cleans the surface thereof, the treatment liquid comprising:

a liquid chemical component which adjusts the pH of the treatment liquid to be in a range of 14 to 16, and an anticorrosive component which is used to prevent corrosion of the Ge-containing layer.

18. The treatment liquid according to claim 17, wherein the concentration of the anticorrosive component is in a range of 0.01% by mass to 20% by mass.

19. The treatment liquid according to claim 17, wherein the anticorrosive component is at least one selected from a compound represented by any of the following Formulae (1) to (6), (10), and (11) and a compound having a repeating unit represented by any of the following Formulae (7) to (9), (1)

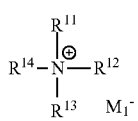

(2)

(3)

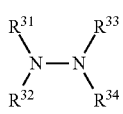

(4)

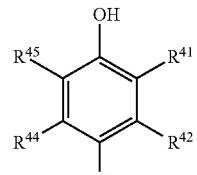

(5)

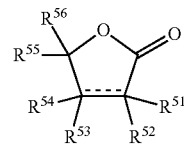

(6)

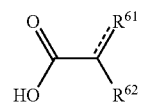

(7)

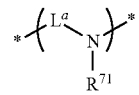

(8)

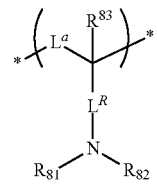

(9)

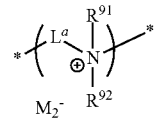

(10)

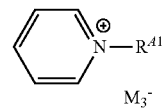

(11)

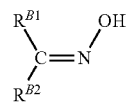

$R^{11}$ to $R^{14}$, $R^{21}$, $R^{22}$, $R^{31}$ to $R^{34}$, $R^{41}$ to $R^{45}$, $R^{51}$ to $R^{56}$, $R^{61}$, $R^{62}$, $R^{71}$, $R^{81}$ to $R^{83}$, $R^{91}$, $R^{92}$, $R^{A1}$, $R^{B1}$, and $R^{B2}$ each independently represent a group including a hydrogen atom, a carbon atom, an oxygen atom, a sulfur atom, or a nitrogen atom, $L^a$ represents a linking group, $M_1^-$, $M_2^-$, and $M_3^-$ represent a counter anion, the broken line in Formula (5) represents any of a single bond and a double bond, and in the case where the broken line represents a double bond, $R^{52}$ and $R^{54}$ are not present, the broken line in Formula (6) means that $R^{61}$ represents an oxygen atom or a sulfur atom so that the oxygen atom or the sulfur atom may constitute a carbonyl group (C=O) or a thiocarbonyl group (C=S) together with a carbon atom to which the oxygen atom or the sulfur atom is bonded, and $L^R$ represents a single bond or a linking group.

20. The treatment liquid according to claim 19, wherein, in Formula (1), $R^{11}$ to $R^{14}$ each independently represent an alkyl group having 1 to 24 carbon atoms, an alkenyl group having 2 to 24 carbon atoms, or an aryl group having 6 to 14 carbon atoms, and at least one of these has 2 or more carbon atoms;

in Formula (2), $R^{21}$ and $R^{22}$ each independently represent a hydrogen atom, an alkyl group having 1 to 12 carbon atoms, an alkenyl group having 2 to 12 carbon atoms, an aryl group having 6 to 14 carbon atoms, an acyl group having 1 to 12 carbon atoms, an alkoxy group having 1 to 12 carbon atoms, an aminocarbonyl group, a hydrazino group, a hydrazinocarbonyl group, or $C(NR^N)NR^N_2$ ($R^N$ represents a hydrogen atom, an alkyl group having 1 to 12 carbon atoms, an alkenyl group having 2 to 12 carbon atoms, or an aryl group having 6 to 14 carbon atoms);

in Formula (3), $R^{31}$ to $R^{34}$ each independently have the same definitions as those for $R^{21}$ and $R^{22}$;

in Formula (4), $R^{41}$ to $R^{45}$ each independently represent a hydrogen atom, a hydroxy group, a carboxyl group, an alkyl group having 1 to 12 carbon atoms, an alkenyl group having 2 to 12 carbon atoms, or an aryl group having 6 to 14 carbon atoms;

in Formula (5), $R^{51}$ to $R^{56}$ each independently represent a hydrogen atom, a hydroxy group, a carboxyl group, an alkyl group having 1 to 12 carbon atoms, an alkenyl group having 2 to 12 carbon atoms, or an aryl group having 6 to 14 carbon atoms;

in Formula (6), $R^{61}$ and $R^{62}$ each independently represent a hydrogen atom, a hydroxy group, a carboxyl group, an alkyl group having 1 to 12 carbon atoms, an alkenyl group having 2 to 12 carbon atoms, an aryl group having 6 to 14 carbon atoms, or an oxygen atom that forms a carbonyl group;

in Formula (7), $R^{71}$ represents a hydrogen atom, an alkyl group having 1 to 12 carbon atoms, an alkenyl group having 2 to 12 carbon atoms, or an aryl group having 6 to 14 carbon atoms, and $L^a$ represents a methylene group;

in Formula (8), $R^{81}$ and $R^{82}$ represent a hydrogen atom, an alkyl group having 1 to 12 carbon atoms, an alkenyl group having 2 to 12 carbon atoms, or an aryl group having 6 to 14 carbon atoms, $L^R$ represents a single bond, an alkylene group having 1 to 12 carbon atoms, an alkenylene group having 2 to 12 carbon atoms, an arylene group having 6 to 14 carbon atoms, or an aralkylene group having 7 to 15 carbon atoms, and $R^{83}$ represents a hydrogen atom or a methyl group;

in Formula (9), $R^{91}$ and $R^{92}$ represents a hydrogen atom, an alkyl group having 1 to 12 carbon atoms, an alkenyl group having 2 to 12 carbon atoms, or an aryl group having 6 to 14 carbon atoms, and $L^a$ represents a methylene group;

in Formula (10), $R^{41}$ represents an alkyl group having 1 to 24 carbon atoms, an alkenyl group having 2 to 24 carbon atoms, or an aryl group having 6 to 14 carbon atoms; and in Formula (11), $R^{B1}$ and $R^{B2}$ each independently represent an alkyl group having 1 to 12 carbon atoms, an alkenyl group having 2 to 12 carbon atoms, an aryl group having 6 to 14 carbon atoms, or an amino group.

21. The treatment liquid according to claim 19, wherein the compound selected from a compound represented by Formula (1) or (10) and the compound having a repeating unit represented by any of Formulae (7) to (9) is used as an inhibitor type anticorrosive component, and the compound represented by any of Formulae (2) to (6) and (11) is used as a reducing agent type anticorrosive component.

22. The treatment liquid according to claim 17 which is a rinsing liquid used to clean the semiconductor substrate.

23. The treatment liquid according to claim 17 which is a developer used to develop a resist on the semiconductor substrate.

24. The treatment liquid according to claim 17, wherein the organic material includes a modified-resist component, and the treatment liquid is a stripper which strips the organic material.

25. The treatment liquid according to claim 17, wherein the liquid chemical component is water when the treatment liquid is used as a rinsing liquid, is an alkali compound when the treatment liquid is used as a developer, and is an alcohol compound, an aprotic solvent, an organic amine compound, or a combination of these when the treatment liquid is used as a stripper.

26. The treatment liquid according to claim 25, wherein a CLogP value of the alcohol compound is 0 or greater.

* * * * *